US010066984B2

(12) United States Patent
Mukai et al.

(10) Patent No.: US 10,066,984 B2
(45) Date of Patent: Sep. 4, 2018

(54) TERAHERTZ DEVICE MODULE

(71) Applicant: ROHM CO., LTD., Kyoto (JP)

(72) Inventors: Toshikazu Mukai, Kyoto (JP); Jae-young Kim, Kyoto (JP); Kazuisao Tsuruda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/808,051

(22) Filed: Nov. 9, 2017

(65) Prior Publication Data
US 2018/0066981 A1 Mar. 8, 2018

Related U.S. Application Data

(63) Continuation of application No. PCT/JP2016/061241, filed on Apr. 6, 2016.

(30) Foreign Application Priority Data

May 12, 2015 (JP) .................. 2015-097284

(51) Int. Cl.
*G01J 5/02* (2006.01)
*G01J 1/02* (2006.01)
*G01J 1/06* (2006.01)
*H01L 31/02* (2006.01)
*H01L 31/167* (2006.01)
(Continued)

(52) U.S. Cl.
CPC ........... *G01J 1/0271* (2013.01); *G01J 1/0209* (2013.01); *G01J 1/06* (2013.01); *H01L 31/0203* (2013.01); *H01L 31/02005* (2013.01); *H01L 31/02325* (2013.01); *H01L 31/03046* (2013.01); *H01L 31/109* (2013.01); *H01L 31/167* (2013.01)

(58) Field of Classification Search
CPC ........ G01J 5/0803; G01J 5/024; G01J 5/0883; G01J 5/0881; G01J 5/10; G01J 5/20; G01J 5/58; G01J 2005/0077; G01J 5/202; G02B 1/002; G02B 1/008; G02B 5/22
See application file for complete search history.

(56) References Cited

U.S. PATENT DOCUMENTS 9,513,171 B2 * 12/2016 Cumming ............. G01J 5/0881
2011/0135318 A1 6/2011 Takeda et al.

FOREIGN PATENT DOCUMENTS

JP S48-93248 A 12/1973
JP 2005-322733 A 11/2005
(Continued)

*Primary Examiner* — Kiho Kim
(74) *Attorney, Agent, or Firm* — Rabin & Berdo, P.C.

(57) ABSTRACT

The THz device module includes: a substrate; a THz device disposed on a front side surface of the substrate, and configured to oscillate or detect THz waves; a cap covering the THz device being separated from the THz device, and comprising an opening formed at a position opposite to the THz device in a vertical direction of the front side surface of the substrate; and a sealing member covering the opening of the cap so as to seal the THz device in conjunction with the substrate and the cap. A distance from the THz device to the sealing member is within a near-field pattern to which an electric field of the THz waves can be reached without interruption from a surface of the THz device to the sealing member. The THz device module efficiently emits or detects THz waves from the opening, thereby suppressing upsizing of the cap.

18 Claims, 25 Drawing Sheets

(51) Int. Cl.
  *H01L 31/0232* (2014.01)
  *H01L 31/0304* (2006.01)
  *H01L 31/109* (2006.01)
  *H01L 31/0203* (2014.01)

(56) References Cited

FOREIGN PATENT DOCUMENTS

| | | |
|---|---|---|
| JP | 2007-124250 A | 5/2007 |
| JP | 2011-124314 A | 6/2011 |
| JP | 2012-217107 A | 11/2012 |
| JP | 2013-171966 A | 9/2013 |

* cited by examiner

TERAHERTZ DEVICE MODULE

CROSS REFERENCE TO RELATED APPLICATIONS

This is a continuation application (CA) of PCT Application No. PCT/JP2016/061241, filed on Apr. 6, 2016, which claims priority to Japan Patent Application No. P2015-97284 filed on May 12, 2015 and is based upon and claims the benefit of priority from prior Japanese Patent Application No. P2015-97284 filed on May 12, 2015 and PCT Application No. PCT/JP2016/061241, filed on Apr. 6, 2016, the entire contents of each of which are incorporated herein by reference.

FIELD

Embodiments described herein relate to a terahertz (THz) device module.

BACKGROUND

In recent years, since miniaturization of electron devices, such as a transistor, progresses, and the size thereof has nano size, a new phenomenon called a quantum effect has been observed. Then, the development which aimed at achieving of ultra high-speed devices or new functional devices is advanced using such a quantum effect. In such environment, trials to perform large capacity communication, information processing, or imaging or measurement, etc. has been performed using the frequency region which is in particular called a THz band and of which frequency is from 0.1 THz ($10^{11}$ Hz) to 10 THz. This frequency domain is undeveloped frequency region between light and electromagnetic waves, and if the device which operates with this frequency band is achieved, being used for many uses, such as measurement in various fields, such as physical characteristics, astronomy, living things, etc. the imaging, the large capacity communication and the information processing mentioned above, is expected.

As THz devices for oscillating high frequency electromagnetic waves of a THz frequency band, there have been known devices having a structure in which a Resonant Tunneling Diode (RTD) and a minute slot antenna is integrated, for example.

Moreover, there has been also disclosed a THz wave radiating apparatus comprising: a cap configured to cover a THz device; and a waveguide connected to the aforementioned cap.

SUMMARY

There was a problem on which a size of the whole package increases to it was necessary to provide a larger opening diameter to a wavelength of an electromagnetic waves oscillated in consideration of an influence of diffraction etc. in the case of it is going to make intensity of radiated electromagnetic waves higher from an opening of a cap to an external object.

The embodiments provide a THz device module capable of efficiently emitting or detecting THz waves from an opening of a cap, thereby suppressing upsizing of the cap.

According to one aspect of the embodiments, there is provided a terahertz device module comprising: a substrate; a terahertz device disposed on a front side surface of the substrate, the terahertz device configured to oscillate or detect terahertz waves; a cap configured to cover the terahertz device so as to be separated from the terahertz device, the cap comprising an opening formed at a position opposite to the terahertz device in a vertical direction of the front side surface of the substrate; and a sealing member configured to cover the opening of the cap so as to seal the terahertz device in conjunction with the substrate and the cap, wherein a distance from the terahertz device to the sealing member is within a near-field pattern to which an electric field of the terahertz waves can be reached without interruption from a surface of the terahertz device to the sealing member.

According to the embodiments, there can be provided the THz device module capable of efficiently emitting or detecting the THz waves from the opening of the cap, thereby suppressing upsizing of the cap.

DESCRIPTION OF EMBODIMENTS

Figure 1:
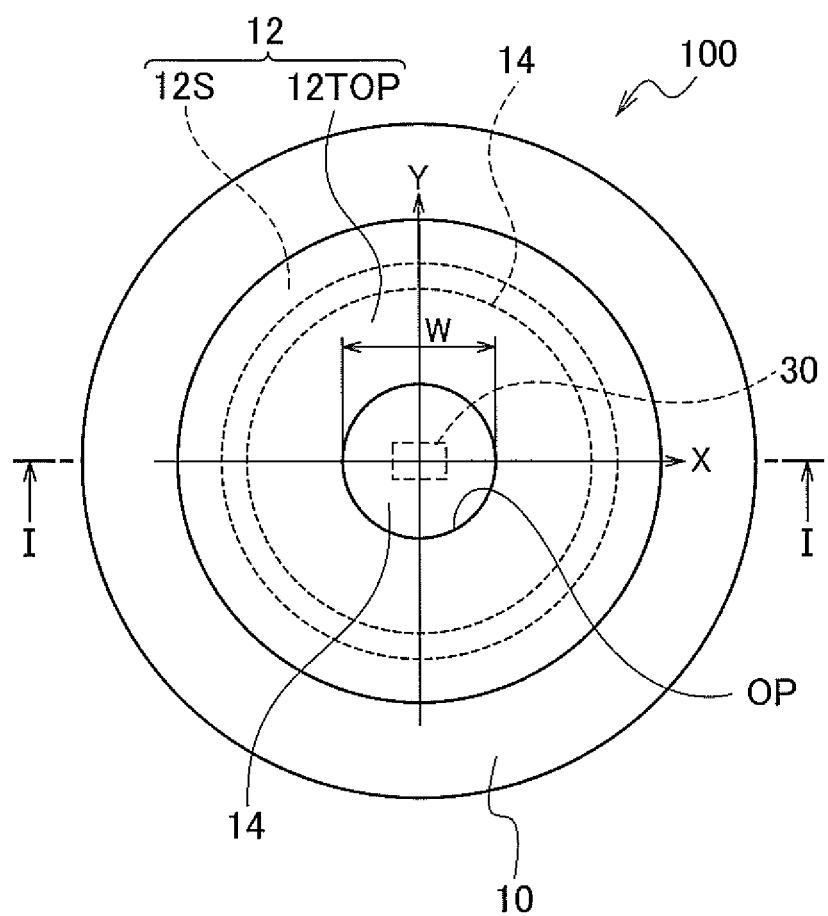
FIG. 1 is a schematic top view diagram showing a THz device module according to an embodiment.

Next, certain embodiments will now be described with reference to drawings. In the following drawings, same blocks or elements are designated by same reference characters to eliminate redundancy and for simplicity. However, it should be known about that the drawings are schematic and are differ from an actual thing. Of course, the part from which the relation and ratio of a mutual size differ also in mutually drawings is included.

Moreover, the embodiments shown hereinafter exemplify the apparatus and method for materializing the technical idea; and the embodiments do not intend to specify the material, shape, structure, placement, etc. of component part (s) as the following. The embodiments may be changed without departing from the spirit or scope of claims.

(THz Device Module)

FIGS. 1 and 2 are diagrams showing a THz device module 100 according to an embodiment.

Figure 2A:
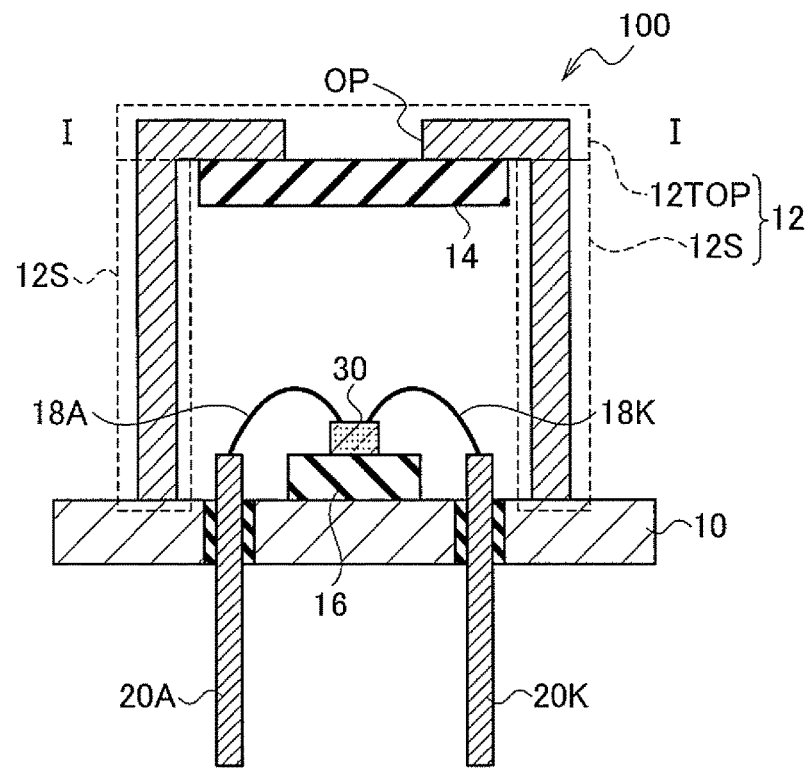
FIG. 2A is a schematic cross-sectional structure diagram taken in the line I-I of FIG. 1 (showing an example of using lead pins 20A and 20K).
Figure 2B:
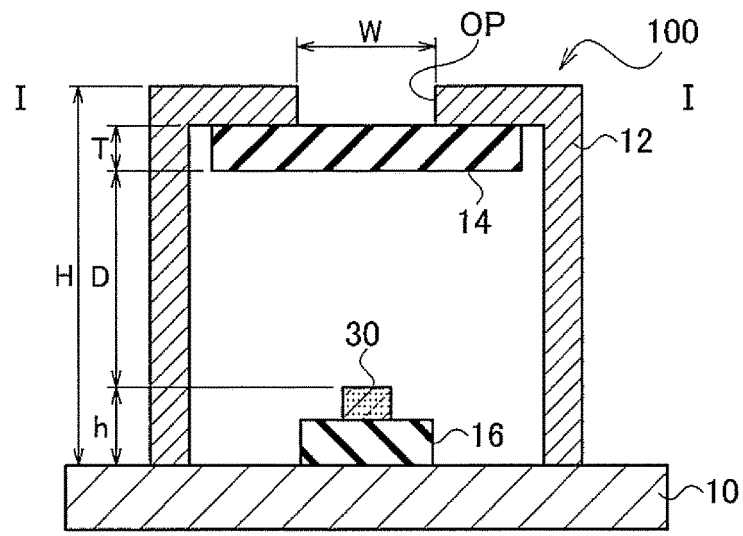
FIG. 2B is a schematic cross-sectional structure diagram taken in the line I-I of FIG. 1 (showing an example of not using lead pins 20A and 20K).

FIG. 2A shows a schematic cross-sectional structure taken in the line I-I of FIG. 1, in an example showing the THz device module 100 using lead pins 20A and 20K. FIG. 2B shows a schematic cross-sectional structure taken in the line I-I of FIG. 1, in an example showing the THz device module 100 not using lead pins 20A and 20K.

As shown in FIGS. 1, 2A and 2B, the THz device module 100 according to the embodiment includes: a package stem 10 as a substrate; a submount 16; a THz device 30; a cap 12; and a sealing member 14.

The package stem 10 includes a front side surface and a back side surface, for example, and is composed by including Fe, FeNi, a glass, or a combination thereof. A shape of the package stem 10 observed from a direction vertical to a front side surface (hereinafter "upper surface") is a circle shape, for example, and a diameter thereof is 5.6 mm. However, the shape observed from the upper surface of the package stem 10 is not limited to the circle shape, but may be a rectangle shape or the like. In addition, the package stem 10 may include the lead pins 20A and 20K provided so as to pass through from the front side surface to back side surface, for example.

The submount 16 is formed on the front side surface of the package stem 10 so as to be bonded on the front side surface of the package stem 10 via an adhesive agent, for example. The submount 16 is composed by including an insulating material, e.g. aluminium nitride, alumina, etc., for example. A shape of the submount 16 observed from the upper surface thereof is a circle shape, and a diameter thereof is approximately 1 mm, for example. However, the shape of the submount 16 observed from the upper surface thereof is not limited to the circle shape, but may be a rectangular parallelepiped or the like. In addition, the submount 16 does not always need to be formed therein. In other words, the THz device module package 100 does not always need to have the submount 16. Moreover, a value of a height h of the submount may be within a range of approximately 200 μm to approximately 1500 μm, for example.

The THz device 30 includes a front side surface and a back side surface, and is formed on a front side surface of the submount 16 so that the back side surface of THz device 30 is opposite to the front side surface of the submount 16. The THz device 30 is formed so as to be bonded to the front side surface of the package stem 10 via an adhesive agent, for example. The THz device 30 is a surface light-emitting radiation type THz device configured to emit THz waves traveling on its own surface by oscillating electromagnetic waves from its own surface, or a surface light-receiving type THz device configured to receive the THz waves from its own surface.

If the THz device 30 includes a lead pin 20A and a lead pin 20K, an anode electrode A of the THz device 30 may be connected to the lead pin 20A through a bonding wire 18A, and a cathode electrode K of the THz device 30 may be connected to the lead pin 20K through a bonding wire 18K. If the THz device 30 does not include the lead pins 20A and 20K, the THz device 30 may have a configuration to include an external terminal (not illustrated) on the back side surface, and in this case the THz device 30 may electrically be connected to a wiring, a terminal, etc. (not illustrated) formed on the front side surface of the package stem 10 through the external terminal.

In this context, the bonding wires 18A and 18K are respectively connected to the anode electrode A and the cathode electrode K of the THz device 30, and the lead pins 20A and 20K can be respectively applied as an anode terminal and a cathode terminal, for example.

In addition, the THz device 30 may be directly formed on the front side surface of the package stem 10 if the THz device module 100 does not include the submount 16, but the THz device module 100 preferably include the submount 16. An electrical interference from an outside transferred from a package stem 10 to the THz device 30 can be suppressed due to the submount 16 included in the THz device module 100.

The cap 12 is formed on the front side surface of the package stem 10, so as to cover the submount 16 and the THz device 30 and to be separated from at least the THz device 30. For example, the cap 12 is formed by including a FeNi alloy as base materials, and Au plating is subjected to the front side surface of the cap 12. The cap 12 includes: a sidewall portion 12S having a cylindrical shape, one end of the sidewall portion 12S connected to the front side surface of the package stem 10; and a ceiling portion 12TOP connected to other end of the sidewall portion 12S, a position of the ceiling portion 12TOP parallel to the front side surface of the package stem 10 and also opposite to the front side surface of the THz device 30 is opened, the opened position of the ceiling portion 12TOP corresponding to at least a position of the THz device 30 observed from the upper surface thereof. The opened portion herein is referred to as an opening OP. The opening OP has a circle shape and a diameter thereof is referred to as a diameter W. A value of the diameter W can be selected from 1200 μm, 1600 μm, 2000 μm, 2400 μm, etc., for example, but is not limited to such values. The cap 12 is composed by including a metal plated with Au, for example, but is not limited to such a metal plated with Au. Moreover, the cap 12 is not limited to above-mentioned metal, but various metals can be applied to the cap 12. A height of the cap 12 from the front side surface of the package stem 10 to an upper surface of the ceiling portion 12TOP herein is referred to as a height H. The Height H is approximately 2300 μm, for example.

Moreover, the diameter W of the opening OP may be within a range of substantially 0.1 time to several times as long as a wavelength of the THz waves emitted or detected from the opening OP. Furthermore, the diameter W of the opening OP may be set as approximately 1 mm substantially equal to the wavelength of the THz waves emitted or detected from the opening OP.

As shown in FIGS. 1, 2A and 2B, the THz device module 100 according to the embodiment includes the submount 16 disposed on the package stem 10, the submount 16 configured to mount the THz device 30. The height of the submount 16 is preferably within a range of substantially 0.2 time to substantially 1.5 times as long as the wavelength of the THz waves emitted or detected from the opening OP.

The sealing member 14 is formed so as to cover the opening OP from a back surface side of the ceiling portion 12TOP of the cap 12. The sealing member 14 is bonded to a part of the ceiling portion 12TOP via an adhesive agent, for example. The sealing member 14 may be a glass substrate, for example, but is not limited to such a glass substrate. The sealing member 14 may be a silicon substrate, and other various transparent substrates can also be applied to the sealing member 14. The sealing member 14 is configured to function as an antenna, and to be capable of radiating or detecting the THz waves from the opening. A thickness of the sealing member 14 herein is referred to as a thickness T. Moreover, a distance from the sealing member 14 to the THz device 30 is referred to as a distance D. Since a thickness of a substrate of the THz device 30 is sufficiently small than the thickness of the submount 16, the distance D is substantially equal to a distance from the sealing member 14 to a front side surface of the submount 16.

In this context, the distance D from the front side surface of the THz device 30 to the sealing member 14 in the THz device module 100 according to the embodiment is set to be within a near-field pattern to which an electric field generated by the THz waves emitted from the THz device 30 can be reached without interruption from the front side surface of the THz device 30 to the sealing member 14. More specifically, the distance D is set to a distance shorter than 1 wavelength of the THz waves emitted from the THz device 30. Accordingly, it is possible to suppress an irregular reflection in the cap 12 occurring due to the THz waves emitted from the THz device 30 being reflected from the sealing member 14.

The THz device module package 100 configured as mentioned above may have the following features.

Moreover, the distance D from the submount 16 disposed on the package stem 10 to the sealing member 14 is preferably equal to or less than ½ of the wavelength of the THz waves emitted or detected from the opening, as proved by a simulation result mentioned below (shown in FIG. 27).

Packages of which an opening diameter is approximately 1 mm have been ordinary used for semiconductor lasers. On the other hand, the wavelength of the THz waves is several 100 times to approximately 1000 times as long as the wavelength of the semiconductor lasers. More specifically, in the embodiment, it is possible to use packages of which the opening diameter is equivalent to the opening diameter (approximately 1 mm) of packages ordinary used for the semiconductor lasers.

Hence, the embodiment can provide the THz device module 100, including the opening of which the diameter W is approximately 1 mm, capable of mounting the THz device of which the wavelength is several 100 times to approximately 1000 times as long as the wavelength of the packages used for the semiconductor lasers, for example.

As mentioned above, in accordance with the THz device module 100 according to the embodiment, the distance D from the front side surface of the THz device 30 to the sealing member 14 is set to be within the near-field pattern to which the electric field when intensity of the THz waves emitted from the THz device 30 is the maximum can be reached without interruption from the front side surface of the THz device 30 to the sealing member 14. Accordingly, the THz waves can be efficiently radiated and detected from the opening OP of the cap 12.

(THz Device)

Figure 3A:
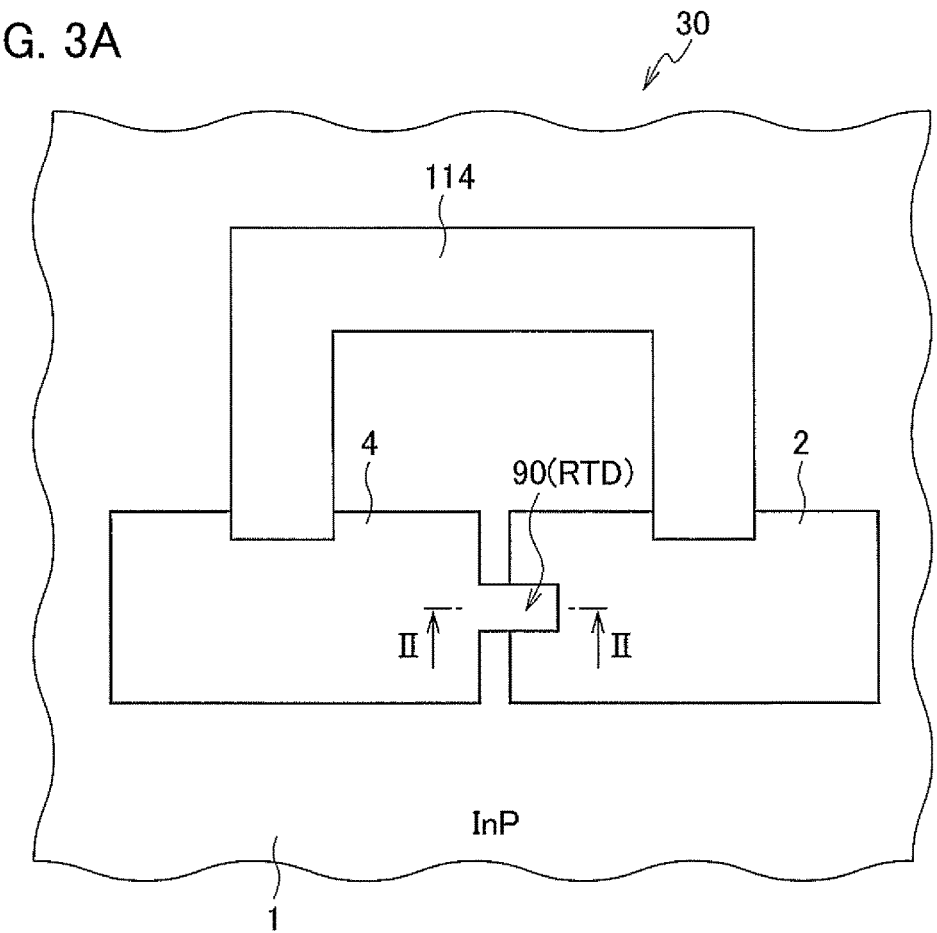
FIG. 3A is a schematic planar pattern configuration diagram showing a THz device which can be mounted on the THz device module according to the embodiment.
Figure 3B:
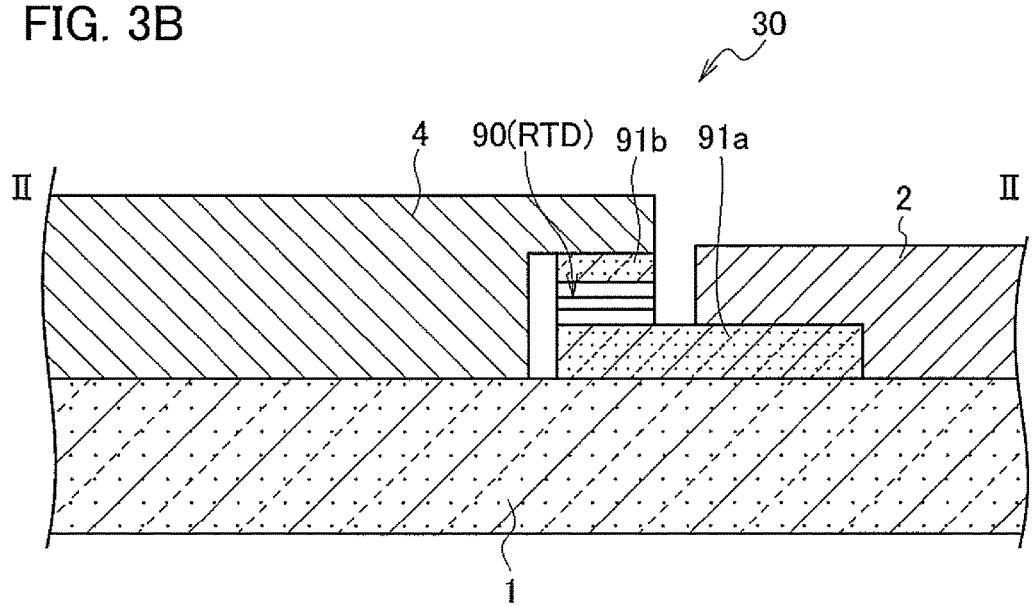
FIG. 3B is a schematic cross-sectional structure diagram taken in the line II-II of FIG. 3A.

FIG. 3A shows a schematic planar pattern configuration of a THz device 30 which can be mounted on the THz device module 100 according to the embodiment, and FIG. 3B shows a schematic cross-sectional structure taken in the line II-II of FIG. 3A.

Figure 4A:
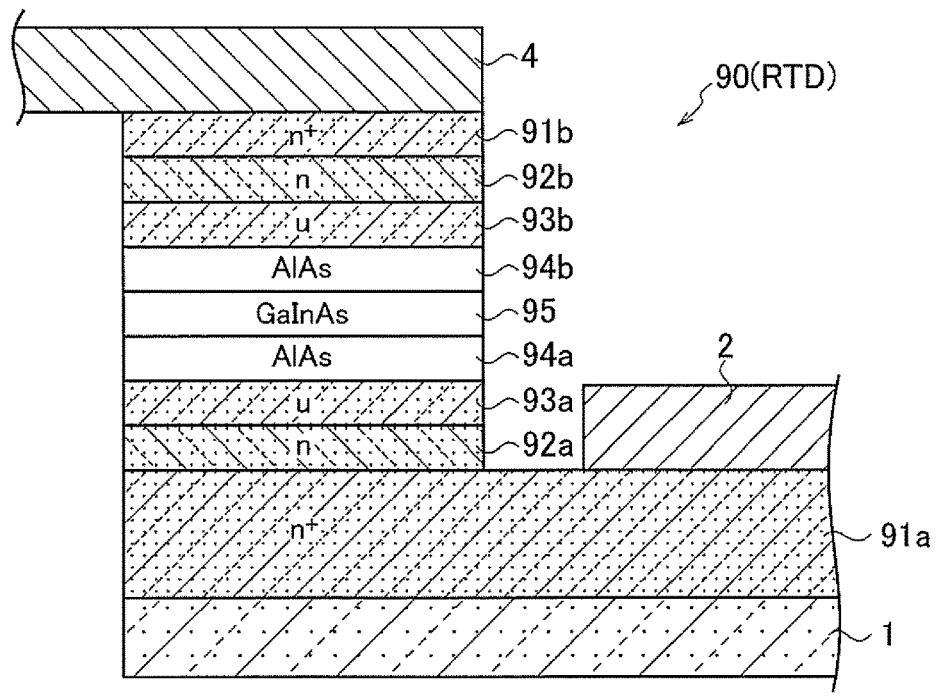
FIG. 4A is a schematic cross-sectional structure diagram showing an active element applicable to the THz device module according to the embodiment.
Figure 4B:
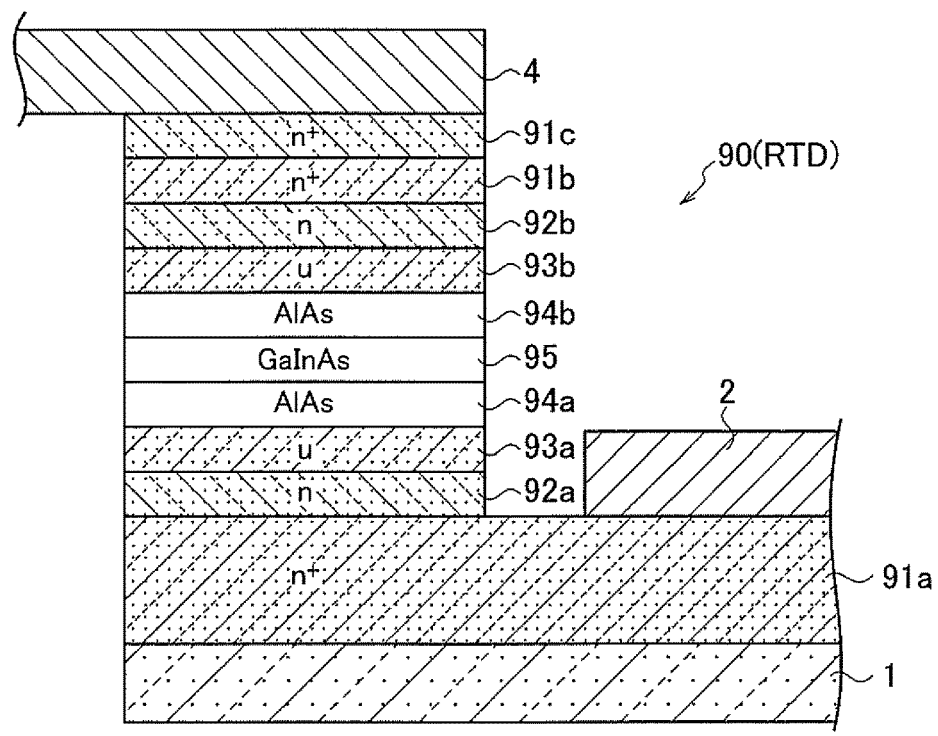
FIG. 4B is another schematic cross-sectional structure diagram showing an active element applicable to the THz device module according to the embodiment.

FIG. 4A shows a schematic cross-sectional structure of an active element 90 applicable to the THz device module 100 according to the embodiment, and FIG. 4B shows another schematic cross-sectional structure of the active element 90. Details of the active element 90 will be mentioned below.

(THz Oscillation Device)

As shown in FIGS. 3A and 3B, the THz device 30 capable of operating as a THz oscillation device includes: a semiconductor substrate 1; a first semiconductor layer 91a disposed on the semiconductor substrate 1; an active element 90 formed by being laminated on the first semiconductor layer 91a; a second electrode 2 connected to the first semiconductor layer 91a so as to be connected to one side of a main electrode of the active element 90, the second electrode 2 disposed on the semiconductor substrate 1; and a first electrode 4 connected to another side of the main electrode of the active element 90, the first electrode 4 disposed on the semiconductor substrate 1 so as to be opposite to the second electrode 2, wherein the THz device 30 is mounted on the submount 16. In this context, the active element 90 forms a resonator between the second electrode 2 and the first electrode 4; and emitted electromagnetic waves are reflected on the submount 16, and have a surface light-emission radiating pattern in a vertical direction with respect to the semiconductor substrate 1. Although illustration is omitted, a metal layer is disposed on the submount 16, and the semiconductor substrate 1 of the THz device 30 is disposed on the aforementioned metal layer.

Moreover, as shown in FIG. 3A, in the THz device 30, the first electrode 4 and the second electrode 2 include a dipole antenna.

Figure 5:
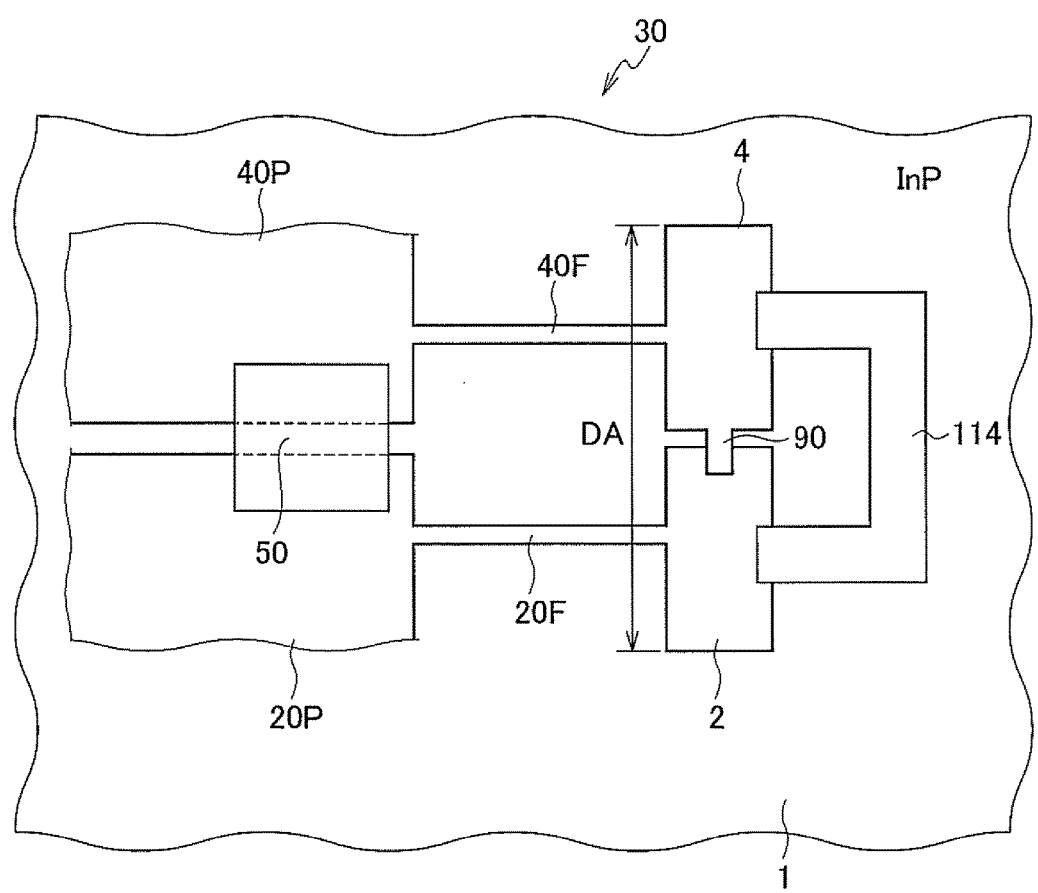
FIG. 5 is a detailed planar pattern configuration diagram showing the THz device which can be mounted on the THz device module according to the embodiment.
Figure 6:
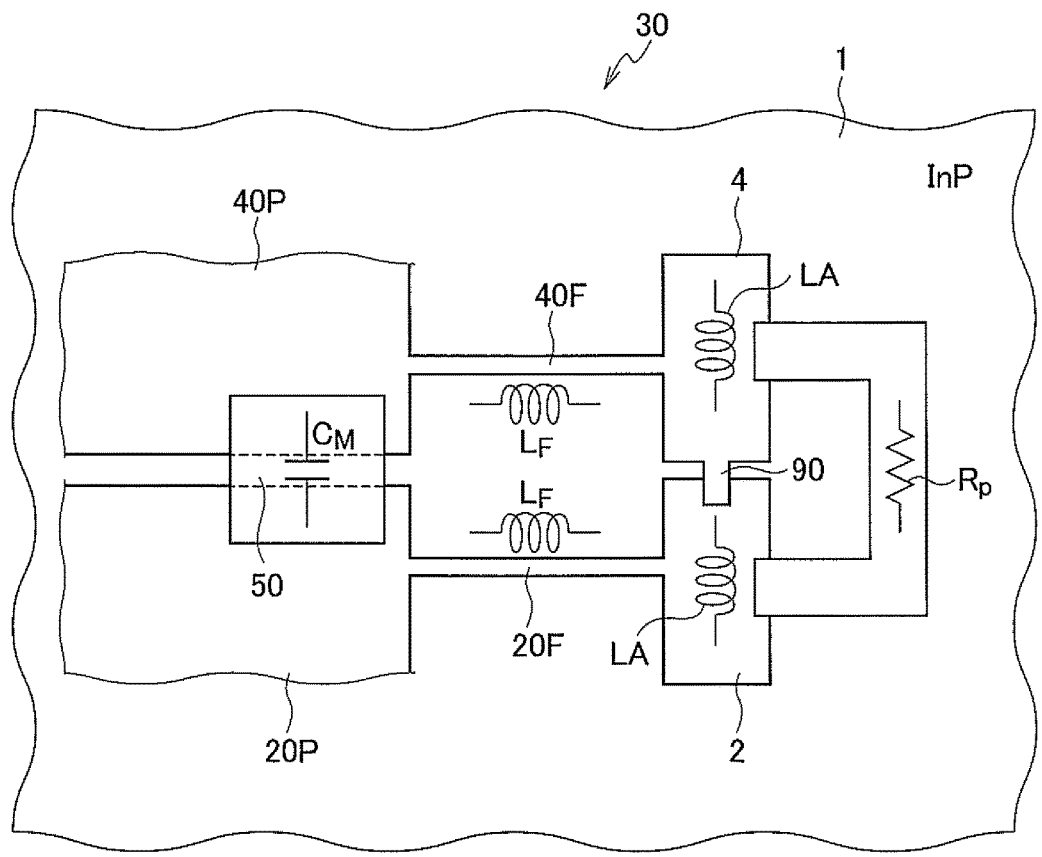
FIG. 6 is an explanatory diagram of a parasitic element parameter in FIG. 5.

FIG. 5, shows a detailed planar pattern configuration of the THz device 30, and FIG. 6 shows an explanation of a parasitic element parameter in FIG. 5.

Figure 7:
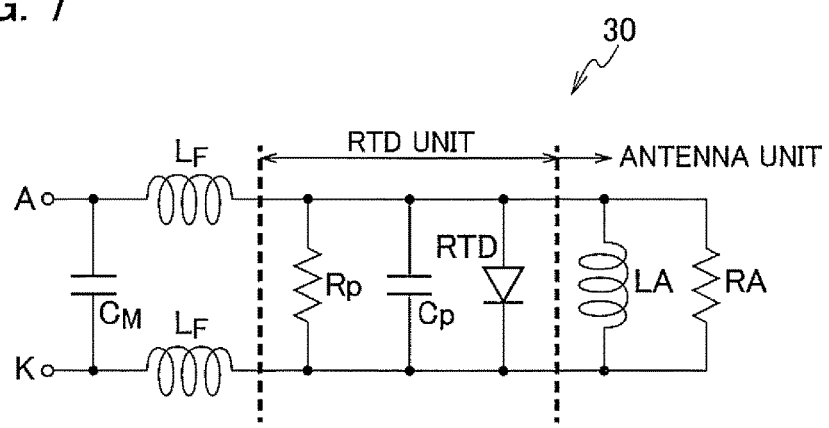
FIG. 7 is an equivalent circuit configuration diagram showing the THz device which can be mounted on the THz device module according to the embodiment.

Moreover, FIG. 7 shows an equivalent circuit configuration of the THz device 30.

As shown in FIGS. 5 and 6, the THz device 30 may include: a first feed electrode line 40F and a second feed electrode line 20F each of which is connected to the dipole antenna; and a first pad electrode 40P and a second pad electrode 20P respectively connected to the first feed electrode line 40F and the second feed electrode line 20F.

Moreover, as shown in FIGS. 5 and 6, the THz device 30 may include an MIM reflector 50 connected between the first pad electrode 40P and the second pad electrode 20P. The MIM reflector 50 can be formed by laminating a portion of each of the pad electrodes 20P and 40P via an insulation layer.

Moreover, as shown in FIGS. 3A, 5, and 6, the THz device 30 may include a resistance element 114 connected between the first electrode 4 and the second electrode 2. In the embodiment, the resistance element 114 may include metallic wiring. For example, the metallic wiring may include bismuth (Bi), nickel (Ni), titanium (Ti), or platinum (Pt).

Moreover, in the THz device 30, the active element 90 may be arranged as multichip implementation.

Moreover, in the THz device 30, the active element 90 may be arranged as cell array implementation. The RTD is typical as the active element 90, but the active element 90 can be composed also from diodes or transistors except for the RTD. As other active elements, for example, a Tunnel Transit Time (TUNNETT) diode, an Impact Ionization Avalanche Transit Time (IMPATT) diode, a GaAs based Field Effect Transistor (FET), a GaN based FET, High Electron Mobility Transistor (HEMT), a Heterojunction Bipolar Transistor (HBT), a Complementary Metal-Oxide-Semiconductor (CMOS) FET, etc. are also applicable thereto.

A THz oscillation device or THz detection device using a negative resistance of the RTD can be configured as the active element 90 applicable to the THz device module 100 according to the embodiment.

More particularly, the first electrode 4 and the second electrode 2 may including Au/Pd/Ti or Au/Ti, for example.

(THz Detection Device)

As shown in FIGS. 3A and 3B, the THz device 30 capable of operating as the THz detection device includes: a semiconductor substrate 1; a first semiconductor layer 91a disposed on the semiconductor substrate 1; an active element 90 formed by being laminated on the first semiconductor layer 91a; a second electrode 2 connected to the first semiconductor layer 91a so as to be connected to one side of a main electrode of the active element 90, the second electrode 2 disposed on the semiconductor substrate 1; and a first electrode 4 connected to another side of the main electrode of the active element 90, the first electrode 4 disposed on the semiconductor substrate 1 so as to be opposite to the second electrode 2, wherein the THz device 30 is mounted on the submount 16. Although illustration is omitted, a metal layer is disposed on the submount 16, and the semiconductor substrate 1 of the THz device 30 is disposed on the aforementioned metal layer. In this context, the active element 90 forms a resonator between the second electrode 2 and the first electrode 4; and Received electromagnetic waves are reflected on the submount 16, and have a surface light-receiving pattern in a vertical direction with respect to the semiconductor substrate 1.

Moreover, as shown in FIG. 3A, in the THz device 30, the first electrode 4 and the second electrode 2 include a dipole antenna. Other configuration of the THz detection device is the same as that of the THz oscillation device.

(Parallel Resistance)

In the THz device 30 including the RTD as the active element 90, a main oscillation in THz bands is regulated due to a parasitic oscillation with respect to an external circuit resulting from the negative resistance of the RTD. As a method of reducing the parasitic oscillation, as shown in FIGS. 3A, 5, and 6, the resistance element 114 is disposed in parallel to the RTD, and thereby the negative resistance can be disappeared with respect to an external circuit.

A resistance $R_{Bi}$ of the resistance element 114 is connected between the anode and the cathode of the RTD in parallel with respect to the resistance $R_{RTD}$ of the RTD. As a result, a combined resistance $R_t$ between the anode A and the cathode K of the RTD is expressed by a resistance $R_{RTD} \cdot R_{Bi}/(R_{RTD}+R_{Bi})$ by which the resistance RRTD of RTD is connected in parallel with the resistance $R_{Bi}$ of the resistance element 114. The resistance $R_{Bi}$ of the resistance element 114 corresponds to the parallel resistance $R_p$ shown in FIG. 6.

The generation of the negative resistance $(-\Delta V/\Delta I)$ is shifted to a relatively large voltage and relatively large current side by disposing the resistance $R_{Bi}$ of the resistance element 114 in parallel with respect to the resistance $R_{RTD}$ of the RTD, and thereby it is effective for suppression for the parasitic oscillation.

Since the parasitic oscillation occurs in a negative resistance region between an external circuit and the THz device, the resistance is disposed in parallel to the RTD so that the negative resistance disappears from the external circuit. In this way, the parasitic oscillation except for the main oscillation can be suppressed.

A required condition for that purpose is expressed by the following equation from the combined resistance $R_t \geq 0$:

$$R_{Bi} \leq = \Delta V/\Delta I (=R_{RTD}) \qquad (1)$$

By wiring with Bi having relatively high resistance value or with metals, e.g., Ni, Ti, and Pt used for semiconductor processes, the parasitic oscillation is suppressed and the main oscillation can be obtained.

In the THz device 30, the resistance wiring for suppressing the parasitic oscillation is directly connected to the dipole antenna unit.

(Equivalent Circuit Configuration)

FIG. 7 shows a simplified equivalent circuit configuration in the case of including the parallel resistance $R_p$, in the THz device 30. In FIG. 7, reference numerals L1 and L2 respectively correspond to inductances of portions respectively corresponding to the feed electrode lines 40F and 20F. Moreover, reference numeral $C_p$ denotes a parasitic capacitance of the RTD unit. Moreover, the RTD of the RTD unit is shown with the circuit symbol of diode. Moreover, the antenna unit is expressed with a parallel circuit composed by including an antenna inductance LA and an antenna resistance RA. Moreover, reference numeral $C_M$ corresponds to a capacitor of the MIM reflector 50. Moreover, external circuits, e.g., a connector, a driving circuit, etc., are connected between the anode A and the cathode K.

(Parasitic Oscillation with Respect to External Circuit)

If an oscillator of THz waves is fabricated using the RTD, a parasitic oscillation occurs with respect to a portion corresponding to an external portion as circuits by being observed from the RTD. If the negative resistance of RTD is appeared from the external circuit, the Q factor in a case of oscillating with the external portion at a low frequency is higher than the Q factor of a resonant circuit which performs an RF fundamental oscillation, and thereby it becomes conditions easy to be oscillated. Accordingly, a parasitic oscillation with respect to the external circuit remarkably occurs.

(Parallel Resistance)

As a method to generally suppress the parasitic oscillation, as shown in FIGS. 3A, 5, 6, and 7, the parallel resistance $R_p$ is disposed with respect to the RTD. Thereby, it is devised so that the Q factor of the parasitic oscillation is reduced to suppress the parasitic oscillation, and electric power is efficiently interchanged to the main oscillation side.

If the negative resistance is disappeared from the external by disposing the parallel resistance $R_p$, the Q factor of the parasitic oscillation which is oscillated with respect to the external at a low frequency is decreased, and the oscillation is hard to occur, compared with the RF fundamental oscillation. Accordingly, the fundamental RF fundamental oscillation occurs.

(Q Factor)

Briefly explaining the Q factor, the Q factor is an index indicating how steady the oscillation state is existing. The Q factor when the parallel resonant circuit is considered is expressed by the following equation:

$$Q = 1/R_t \sqrt{(LA/C_p)} \qquad (2)$$

Such disposition of the parallel resistance $R_p$ corresponds to increasing the combined resistance $R_t$.

If the Q factor of the parasitic oscillation as expressed above is considered on the basis of the Equation (2), the disposition of the parallel resistance $R_p$ corresponds to increasing the combined resistance $R_p$, and decrease of the Q factor can be realized as a result. It is proved that the parasitic oscillation can be suppressed by disposing the parallel resistance $R_p$.

(Example of Microphotograph of Device Surface of RTD)

Figure 8:
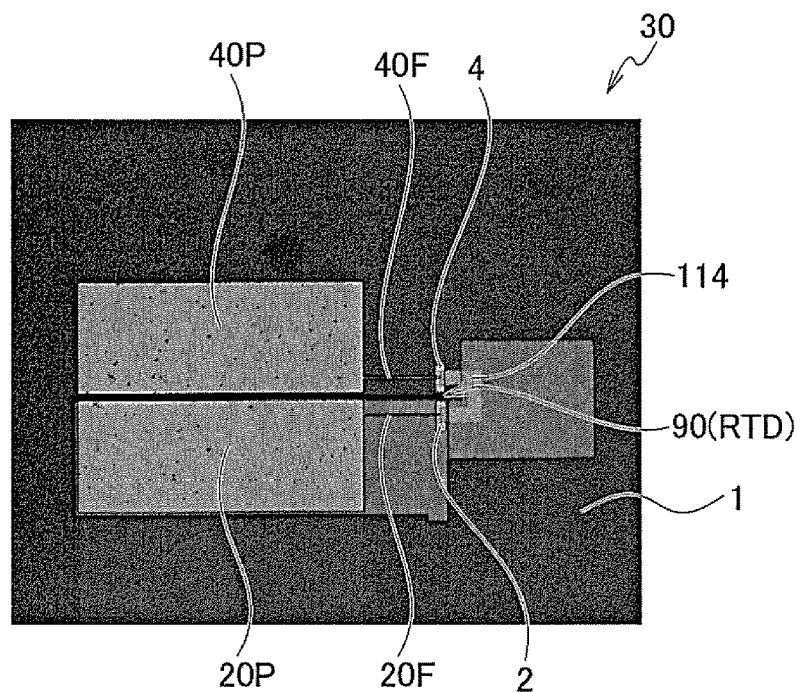
FIG. 8 shows an example of a microphotograph of a surface of the THz device which can be mounted on the THz device module according to the embodiment.
Figure 9:
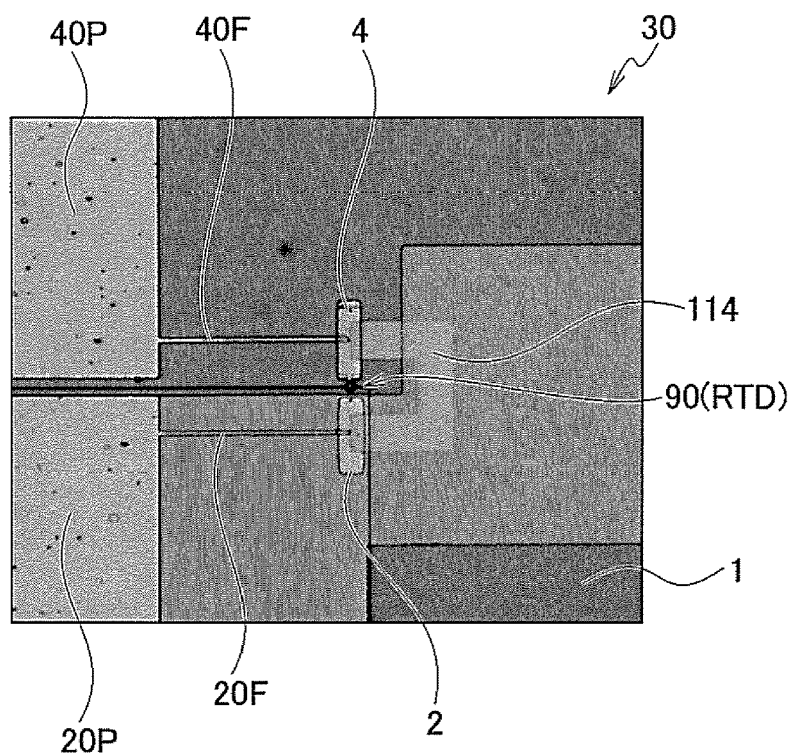
FIG. 9 shows an example of an enlarged microphotograph of the surface of the device shown in FIG. 8.

FIG. 8 shows an example of a microphotograph of a device surface of the THz device 30 which can be mounted on the THz device module 100 according to the embodiment, and FIG. 9 shows an example of an enlarged microphotograph of the surface of the device shown in FIG. 8. The examples shown in FIGS. 8 and 9 corresponds to a detailed example of a planar pattern configuration of the THz device 30 shown in FIG. 5. Although the example in which the MIM reflector 50 is not formed is shown in FIGS. 8 and 9, the MIM reflector 50 can be formed by laminating a portion of each of the pad electrodes 20P and 40P via an insulation layer in the same manner as FIG. 5.

The parallel resistance $R_p$ can be fabricated using Bi having relatively high resistance value or metals, e.g., Ni, Ti, Pt, etc., used for semiconductor processes, in the THz device 30. A step coverage of stepped portions due to a structure of the device can be improved by oblique deposition etc., and thereby a demonstration of operation of the device can be realized.

(Oscillation Frequency Characteristics)

Figure 10:
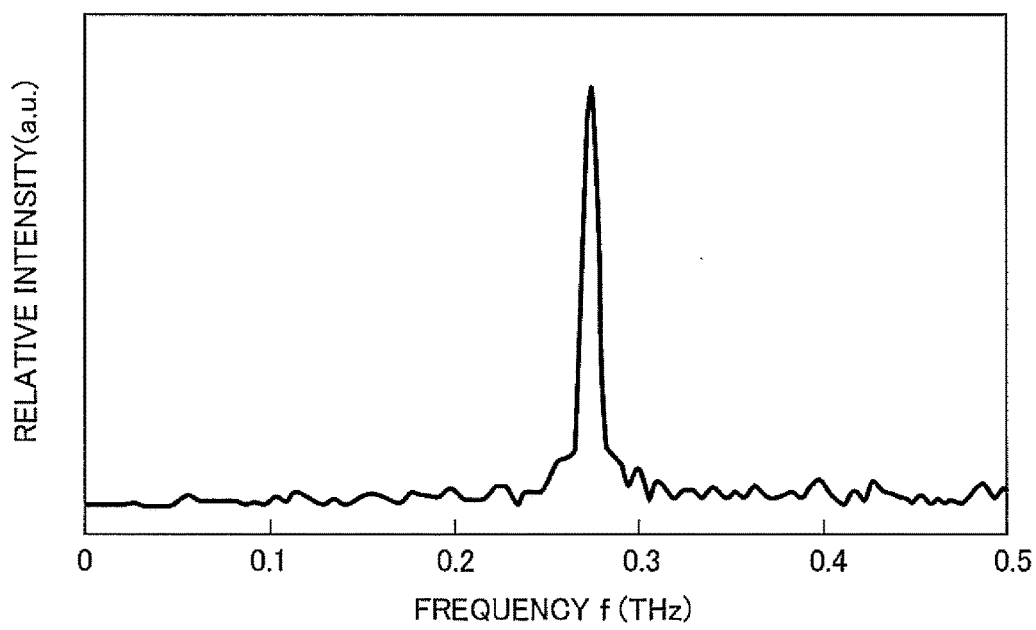
FIG. 10 shows oscillation frequency characteristics of the THz device which can be mounted on the THz device module according to the embodiment.

FIG. 10 shows an example of oscillation frequency characteristics of the THz device 30 which can be mounted on the THz device module 100 according to the embodiment. In the example shown in FIG. 10, a peak of oscillation intensity (arbitrary unit) is obtained at approximately 0.27 THz.

(Simulation Result)

Figure 11A:
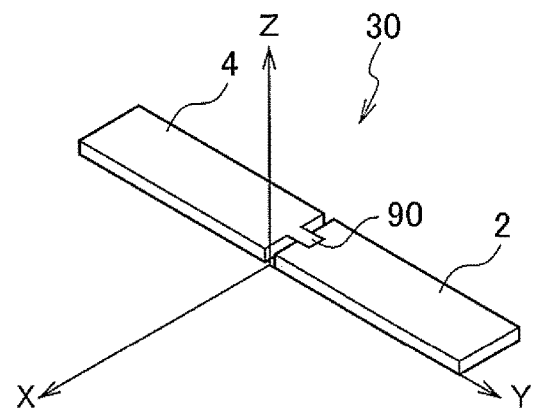
FIG. 11A is a schematic bird's-eye view of the THz device which can be mounted on the THz device module according to the embodiment used for a dipole antenna calculation model.
Figure 11B:
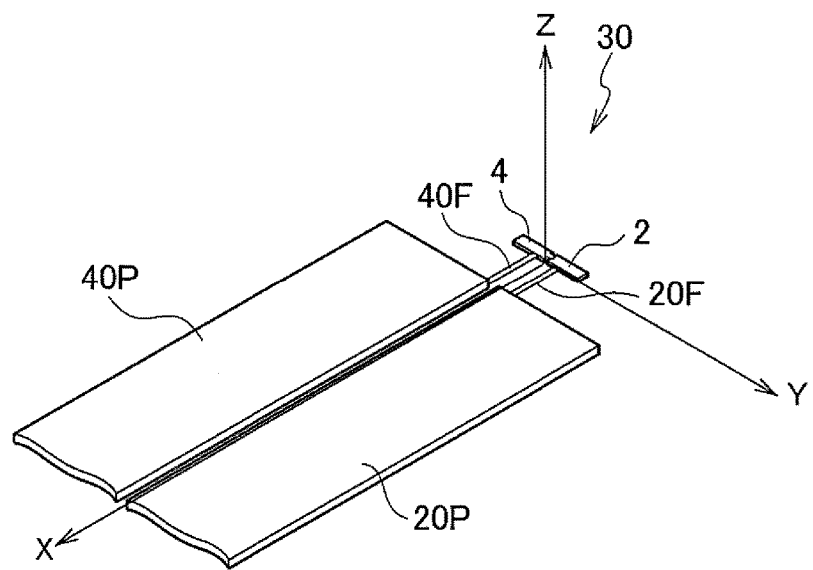
FIG. 11B is a schematic bird's-eye view of the THz device which can be mounted on the THz device module according to the embodiment used for the dipole antenna calculation model including a feed electrode line and a pad electrode.

FIG. 11A shows a schematic bird's-eye view of the THz device 30 which can be mounted on the THz device module 100 according to the embodiment used for a dipole antenna calculation model, and FIG. 11B shows a schematic bird's-eye view of the THz device 30 used for the dipole antenna calculation model including feed electrode lines 40F and 20F and pad electrodes 40P and 20P. Both are calculated as the models including a metal layer disposed on the submount 16.

In the present embodiment, the pad electrodes 40P and 20P respectively compose transmission lines. The width of the pad electrodes 40P and 20P (width of the transmission lines) is set to 75 μm, for example, a gap between the pad electrodes 40P and 20P (gap between the transmission lines) is set to 5 μm, for example, and the length of the pad electrodes 40P and 20P (the length of the transmission lines) is set to 300 μm, for example.

The feed electrode lines 40F and 20F compose a connection unit between the dipole antenna (2 and 4) and the pad electrodes 40P and 20P. The length of the feed electrode lines 40F and 20F is set to a range of 20 μm to 100 μm, for example, and the width thereof is set to a range of 1 μm to 10 μm, for example.

Moreover, an antenna length DA of the dipole antenna (2.4) (refer to FIG. 5) is set to 320 μm, for example.

Figure 12B:
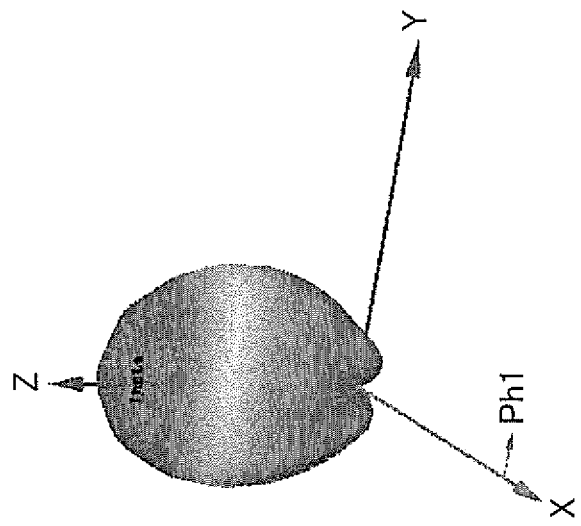
FIG. 12B shows a simulation result in an oscillation frequency of 320 GHz, in a radiating pattern of the THz device which can be mounted on the THz device module according to the embodiment.
Figure 12A:
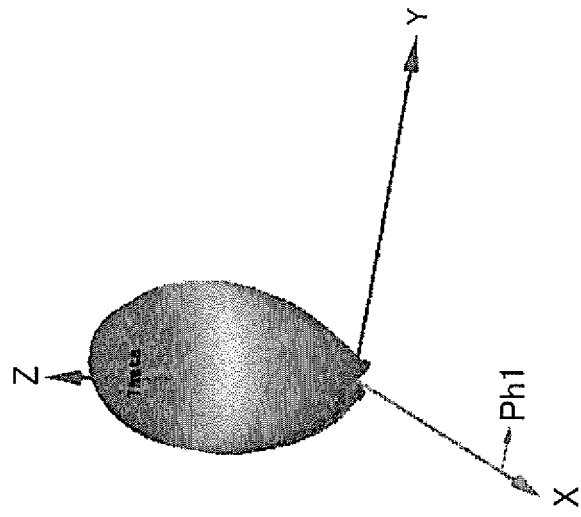
FIG. 12A shows a simulation result in an oscillation frequency of 300 GHz, in a radiating pattern of the THz device which can be mounted on the THz device module according to the embodiment.

FIG. 12A shows a simulation result in an oscillation frequency of 300 GHz in a radiating pattern of the THz device 30 which can be mounted on the THz device module 100 according to the embodiment, and FIG. 12B shows a simulation result in an oscillation frequency of 320 GHz. The simulation results shown in FIGS. 12A and 12B are results of being calculated on the basis of the dipole antenna calculation model including the feed electrode lines 40F and 20F and the pad electrodes 40P and 20P shown in FIG. 11B.

In the THz device 30, a satisfactory surface-emitting type radiating pattern is obtained at equal to or less than approximately 330 GHz, for example, as clearly from the simulation results.

Compared with a chip area (1.5 mm×3.0 mm) of the THz device including a tapered slot antenna as a comparative example, A chip area of the THz device 30 including the dipole antenna is approximately 0.5 mm×0.5 mm, for example, and is microfabricated to approximately 1/18 of the chip area of the comparative example. Furthermore, the chip size thereof can also be microfabricated to equal to or less than approximately 0.5 mm×0.5 mm.

In the THz device 30, the metal layer disposed on the submount is disposed thereon, and thereby surface light emission radiation of the THz waves to the semiconductor substrate front surface side can be realized using a reflection produced by the aforementioned metal layer. The oscillation frequency can be controlled by changing the antenna length DA. Moreover, antenna efficiency can also be controlled by adjusting the length, the width, or the arrangement position of the feed electrode lines 40F and 20F which compose the connection unit.

—RTD—

As shown in FIG. 4A, a constructional example of the RTD as the active element 90 applicable to the THz device 30 includes: a GaInAs layer 91a disposed on a semiconductor substrate 1 composed including a semi insulating InP substrate, the GaInAs layer 91a highly doped with an n type impurity; a GaInAs layer 92a disposed on the GaInAs layer 91a, the GaInAs layer 92a doped with an n type impurity; a undoped GaInAs layer 93a disposed on the GaInAs layer 92a; an RID portion composed by including an AlAs layer 94a/GaInAs layer 95/AlAs layer 94b disposed on the GaInAs layer 93a; an undoped GaInAs layer 93b disposed on the AlAs layer 94b; a GaInAs layer 92b disposed on the GaInAs layer 93a, the GaInAs layer 92b doped with an n type impurity; a GaInAs layer 91b disposed on the InGaAs layer 92b, the GaInAs layer 91b highly doped with an n type impurity; a first electrode 4 disposed on the GaInAs layer 91b; and a second electrode 2 disposed on the GaInAs layer 91a.

As shown in FIG. 4B, another configuration example of the RTD as the active element 90 applicable to the THz device 30 includes a GaInAs layer 91c disposed on the GaInAs layer 91b, the GaInAs layer 91c highly doped with an n type impurity, and the first electrode 4 is disposed on the GaInAs layer 91c. Thus, the GaInAs layer 91c may be formed in order to realize more satisfactory contact between the first electrode 4 and the GaInAs layer 91b.

In the embodiment, the thickness of each layer is, for example, as follows:

The thicknesses of the n$^+$ GaInAs layers 91a, 91b, 91c are respectively approximately 400 nm, approximately 15 nm, and approximately 8 nm, for example. The thicknesses of the n type GaInAs layers 92a and 92b are substantially equal to each other, and respectively are approximately 25 nm, for example. The thicknesses of the undoped GaInAs layers 93a and 93b are thicknesses for realizing the above-mentioned asymmetry, for example, and respectively are approximately 2 nm and 20 nm. The thicknesses of the AlAs layers 94a and 94b are equal to each other, and respectively are approximately 1.1 nm, for example. The thickness of the GaInAs layer 95 is approximately 4.5 nm, for example.

In addition, an $SiO_2$ film, an $Si_3N_4$ film, a SiON film, an $HfO_2$ film, an $Al_2O_3$ film, etc., or an insulating film composed by including the aforementioned multilayer films is deposited on the sidewall part of the layered structure shown in FIGS. 4A and 4B. The insulating layer can be formed by a CVD (Chemical Vapor Deposition) method or a spattering technique.

Due to the layered structure composed by including the metal/insulator/metal of the MIM reflector 50, the pad electrodes 40P, 20P are short-circuited in terms of high frequencies. Moreover, the MIM reflector 50 produces an effect to reflect high-frequency waves as it is open in terms of direct current.

Each of the first electrode 4 and the second electrode 2 is composed by including a metal layered structure of Au/Pd/Ti, for example, and the Ti layer is a buffer layer for making satisfactory a contact state with the semiconductor substrate 1 including a semi insulating InP substrate. The thickness of each unit of the first electrode 4 and the second electrode 2 is approximately several 100 nm, for example, and a planarized layered structure is produced as a whole. Each of the first electrode 4 and the second electrode 2 can be formed by a vacuum evaporation method or a sputtering technique.

The insulation layer of the MIM reflector can be formed including a $SiO_2$ film, for example. Other films, e.g. an $Si_3N_4$ film, a SiON film, an $HfO_2$ film, an $Al_2O_3$ film, etc. are also applicable to the insulating film. In addition, the thickness of the insulating layer can be determined in consideration of a geometric plane size of the MIM reflector 50 and a required capacitor value on circuit characteristics, for example, and may be set to several 10 nm to several 100 nm. The insulating layer can be formed by CVD or a spattering technique.

Although an example of the first tunnel barrier layer/Quantum Well (QW) layer/second tunnel barrier layer has a configuration of AlAs/InAlAs/AlAs is shown, materials of the THz device 30 is not limited to such materials. For example, an example of the first tunnel barrier layer/quantum well layer/second tunnel barrier layer having a configuration of AlGaAs/GaAs/AlGaAs may be suitable therefor. Alternatively, an example of the first tunnel barrier layer/quantum well layer/second tunnel barrier layer having a configuration of AlGaN/GaN/AlGaN may be suitable therefor. Alternatively, an example of the first tunnel barrier layer/quantum well layer/second tunnel barrier layer having a configuration of SiGe/Si/SiGe may be suitable therefor.

(Relationship Between Relative Intensity and Height of Submount)

Figure 13:
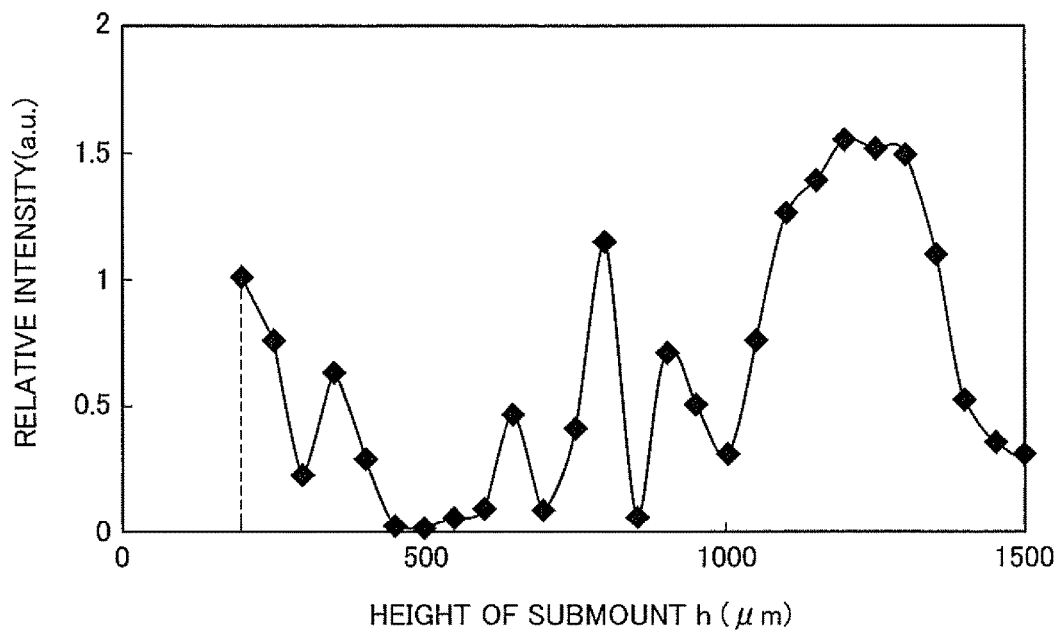
FIG. 13 is a diagram showing a relationship between relative intensity and a height h of a submount, as an example of package stem mounting simulation, in the THz device module according to the embodiment.

FIG. 13 shows a relationship between relative intensity and a height h of the submount, as an example of package stem mounting simulation, in the THz device module 100 according to the embodiment. FIG. 13 shows a relative intensity by which intensity at a time when a height h of the submount is 200 µm is set to 1. As shown in FIG. 13, the height h of submount is set as a calculation parameter in the package stem mounting simulation so that the height h can be changed in increments of 50 µm from 200 µm to 1500 µm.

In the THz device module 100 according to the embodiment, it is expected that the relative intensity can be improved by changing the height h of the submount, as shown in FIG. 13. For example, an output can be improved by approximately 1.55 times by increasing the height h of the submount up to 1200 µm from 200 µm.

(Electromagnetic Field Simulator Executed Using High-Frequency Structure Simulator (HFSS))

Figure 14:
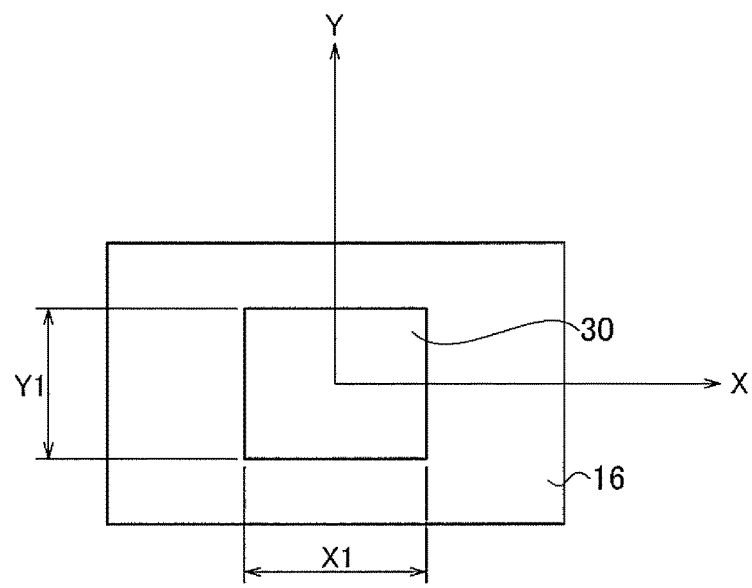
FIG. 14 is a schematic top view diagram showing an arrangement configuration of the submount and the THz device, in the THz device module according to the embodiment.

FIG. 14 shows a schematic top view diagram showing an arrangement configuration of the submount 16 and the THz device 30, in the THz device module 100 according to the embodiment. Although the THz device 30 is schematically shown with a rectangular block in FIG. 14, the detailed configuration is the same configuration as shown in the above-mentioned FIGS. 5, 8, and 9, and the surface light emission radiating or surface light-receiving can be executed. An active element, e.g. RTD, is disposed at a center of the coordinate axes X-Y shown in FIG. 14. As shown in FIG. 14, a width along an X axial direction of the THz device 30 is expressed by X1, and a width along a Y axial direction thereof is expressed by Y1.

Figure 15A:
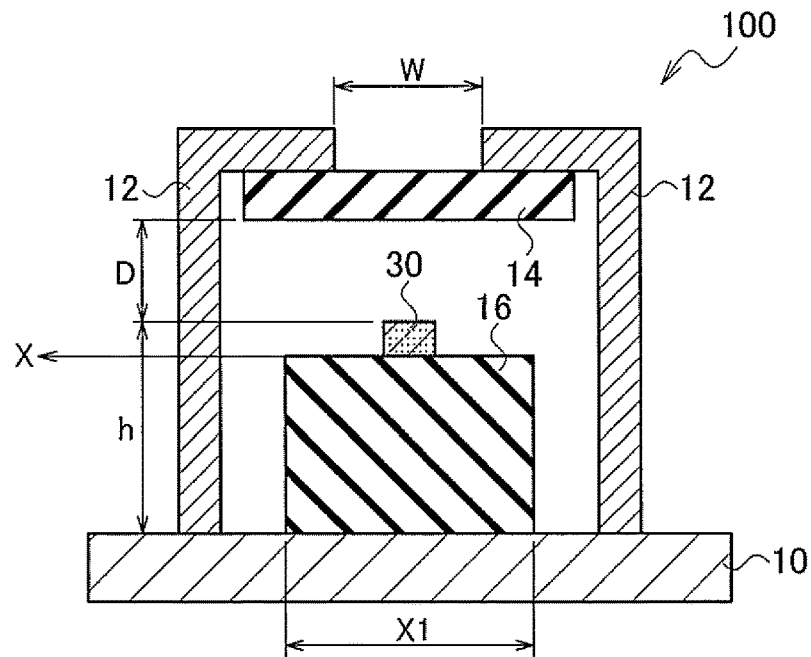
FIG. 15A is a schematic cross-sectional structure diagram which is cut at a vertical plane with respect to a package stem along the X-axis, in the THz device module according to the embodiment.
Figure 15B:
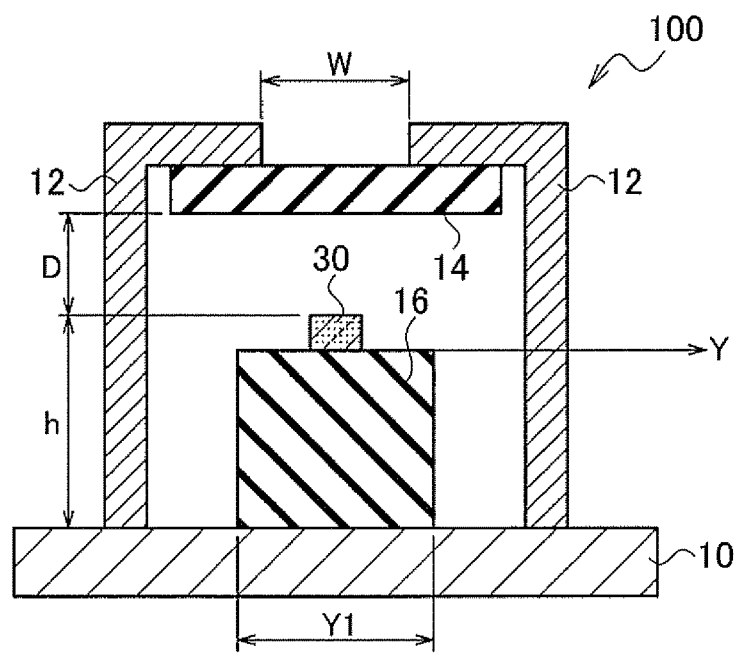
FIG. 15B is a schematic cross-sectional structure diagram which is cut at the vertical plane with respect to the package stem along the Y-axis, in the THz device module according to the embodiment.

FIG. 15A shows a schematic cross-sectional structure which is cut at a vertical plane with respect to a package stem 10 along the X-axis, in the THz device module 100 according to the embodiment, and FIG. 15B shows a schematic cross-sectional structure which is cut at a vertical plane with respect to the package stem 10 along the Y-axis. Since a configuration of each portion shown in FIGS. 15A and 15B is the same as that shown in FIGS. 1, 2A, and 2B, a duplicated description is omitted. The configuration shown in FIGS. 15A and 15B corresponds to a fundamental structure of the electromagnetic field simulation executed using the HFSS to be explained hereinafter.

Figure 16A:
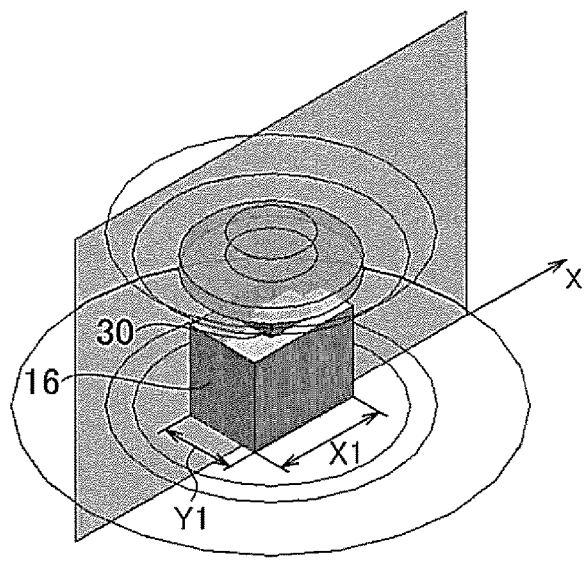
FIG. 16A is an explanatory diagram of an electromagnetic field simulation executed using a High-Frequency Structure Simulator (HFSS) on a surface parallel to the X-axis, in the THz device module according to the embodiment.
Figure 16B:
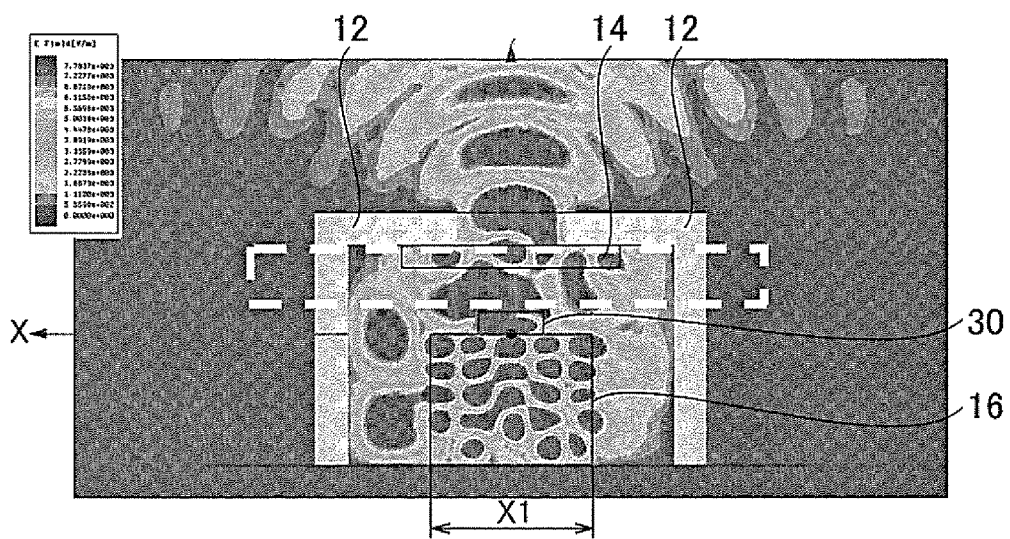
FIG. 16B shows a result of an electromagnetic field simulation (the height h of the submount=1200 μm) executed using the high-frequency three-dimensional electromagnetic field simulator (HFSS) on the surface parallel to the X-axis, in the THz device module according to the embodiment.

In the THz device module 100 according to the embodiment: FIG. 16A shows an explanatory diagram of the electromagnetic field simulation executed using the HFSS on a surface parallel to the X-axis; and FIG. 16B shows a result of the electromagnetic field simulation (the height h of the submount=1200 µm) executed using the high-frequency three-dimensional electromagnetic field simulator (e.g., HFSS) on the surface parallel to the X-axis.

Figure 17A:
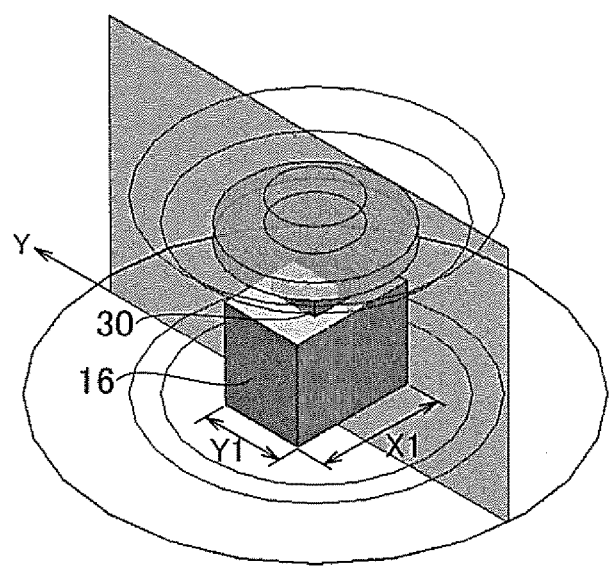
FIG. 17A is an explanatory diagram of the electromagnetic field simulation executed using the HFSS on a surface parallel to the Y-axis, in the THz device module according to the embodiment.
Figure 17B:
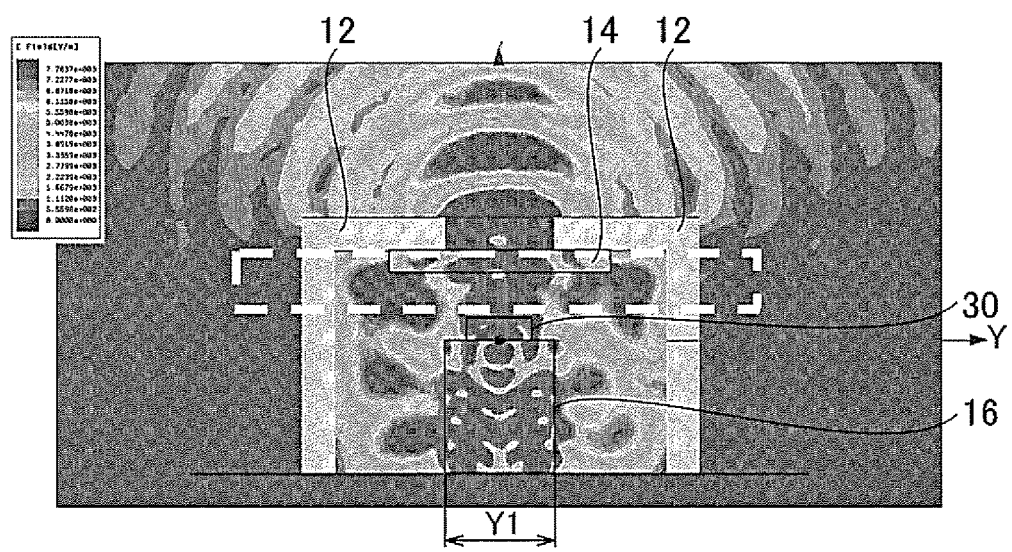
FIG. 17B shows a result of the electromagnetic field simulation (the height h of the submount=1200 μm) executed using the HFSS on the surface parallel to the Y-axis, in the THz device module according to the embodiment.

Moreover, in the THz device module 100 according to the embodiment: FIG. 17A shows an explanatory diagram of the electromagnetic field simulation executed using the HFSS on a surface parallel to the Y-axis; and FIG. 17B shows a result of the electromagnetic field simulation (the height h of the submount=1200 µm) executed using the HFSS on the surface parallel to the Y-axis.

Figure 18:
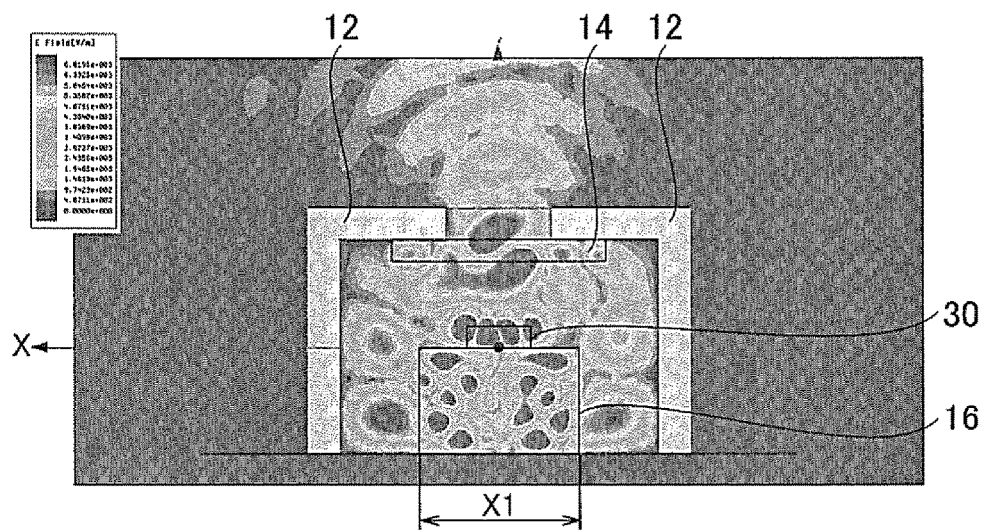
FIG. 18 shows a result of the electromagnetic field simulation (the height h of the submount=1000 μm) executed using the HFSS on a surface parallel to the X-axis, in the THz device module according to the embodiment.
Figure 19:
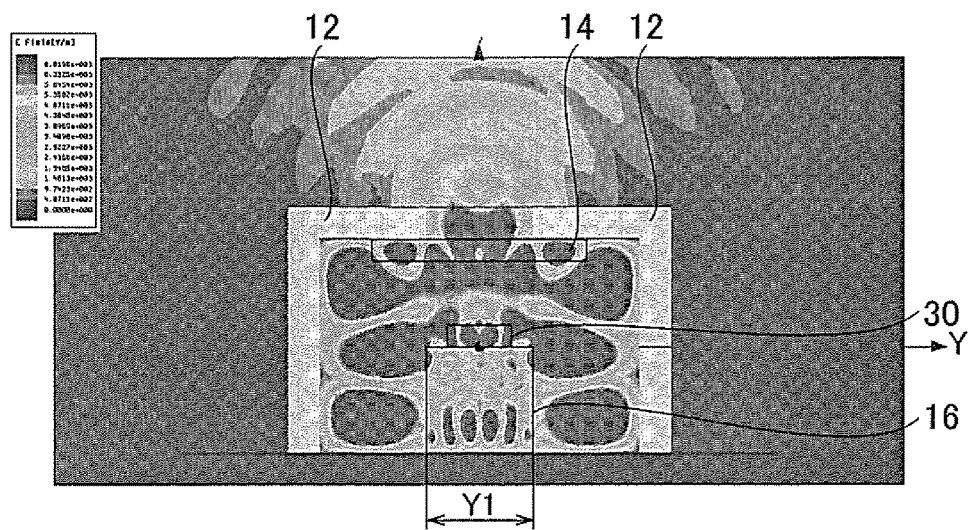
FIG. 19 shows a result of the electromagnetic field simulation (the height h of the submount=1000 μm) executed using the HFSS on the surface parallel to the Y-axis, in the THz device module according to the embodiment.

Similarly, in the THz device module 100 according to the embodiment, FIG. 18 shows an explanatory diagram of the electromagnetic field simulation (the height h of the submount=1000 µm) executed using the HFSS on the surface parallel to the X-axis; and FIG. 19 shows a result of the electromagnetic field simulation (the height h of the submount=1000 µm) executed using the HFSS on the surface parallel to the Y-axis.

Figure 20:
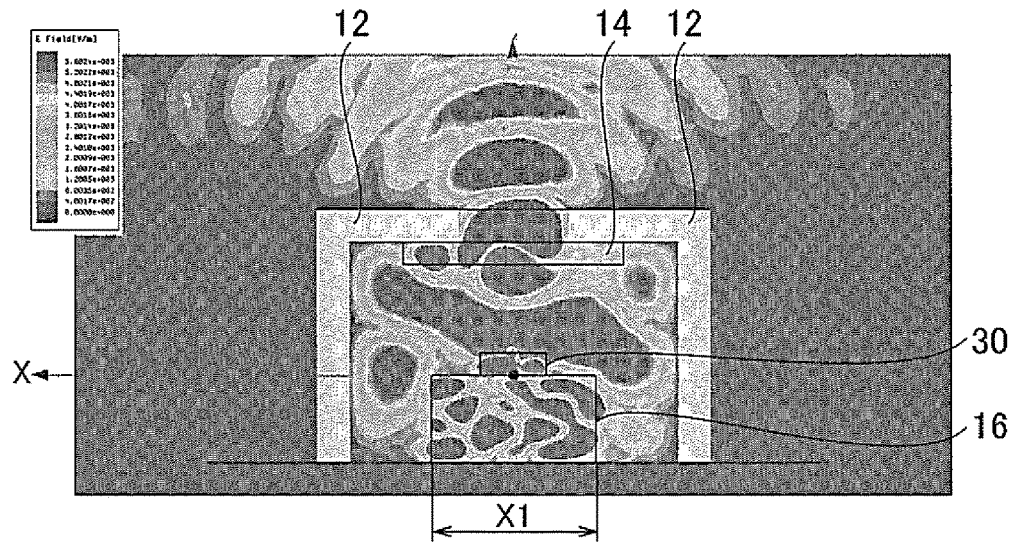
FIG. 20 shows a result of the electromagnetic field simulation (the height h of the submount=800 μm) executed using the HFSS on the surface parallel to the X-axis, in the THz device module according to the embodiment.
Figure 21:
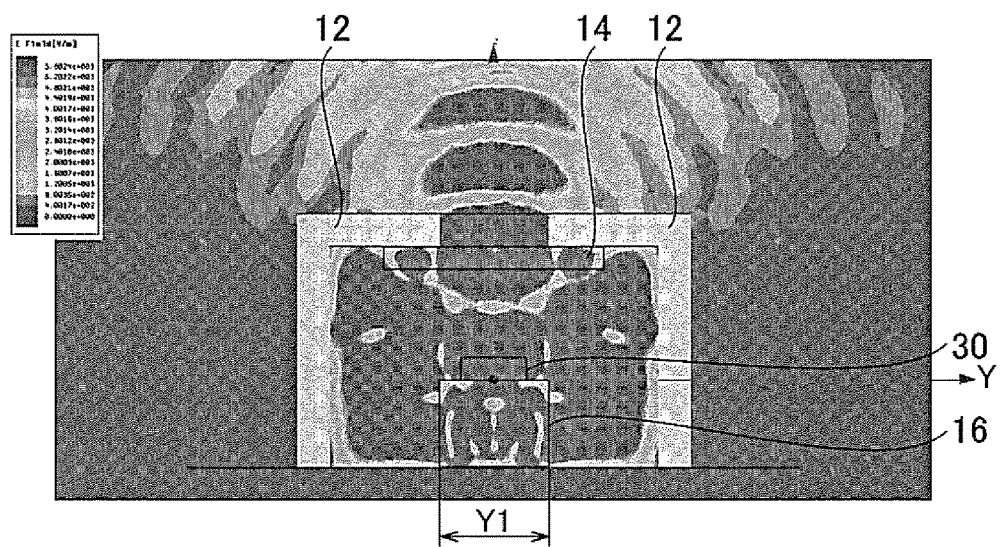
FIG. 21 shows a result of the electromagnetic field simulation (the height h of the submount=800 μm) executed using the HFSS on the surface parallel to the Y-axis, in the THz device module according to the embodiment.

Similarly, in the THz device module 100 according to the embodiment, FIG. 20 shows an explanatory diagram of the electromagnetic field simulation (the height h of the submount=800 µm) executed using the HFSS on the surface parallel to the X-axis; and FIG. 21 shows a result of the electromagnetic field simulation (the height h of the submount=800 µm) executed using the HFSS on the surface parallel to the Y-axis.

Figure 22:
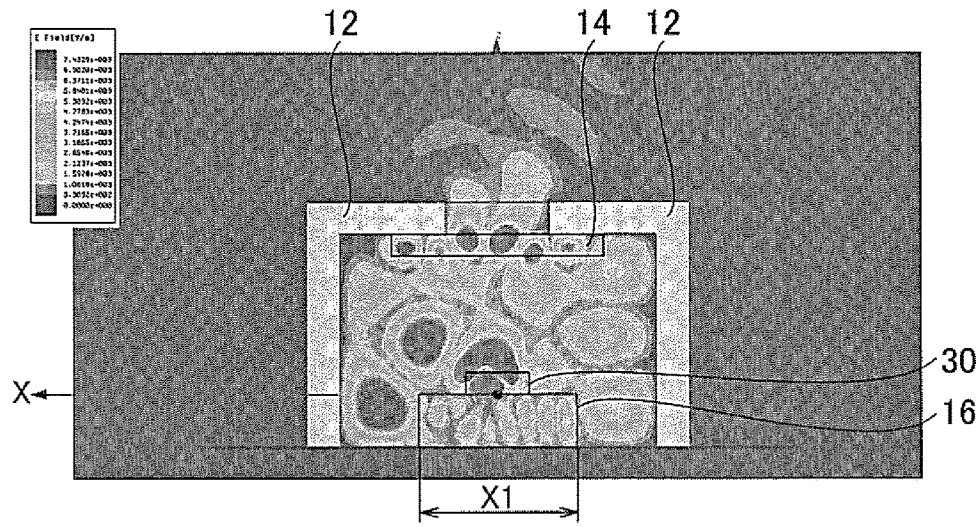
FIG. 22 shows a result of the electromagnetic field simulation (the height h of the submount=500 μm) executed using the HFSS on the surface parallel to the X-axis, in the THz device module according to the embodiment.
Figure 23:
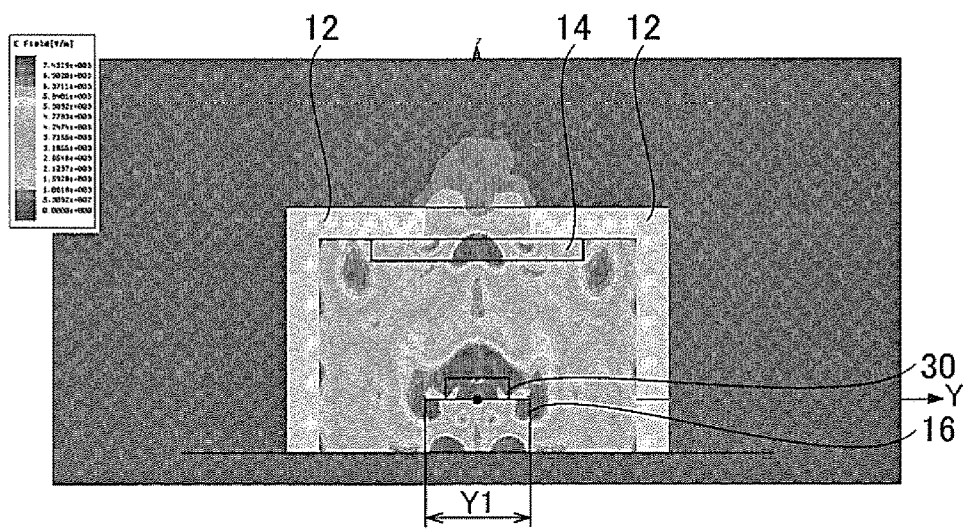
FIG. 23 shows a result of the electromagnetic field simulation (the height h of the submount=500 μm) executed using the HFSS on the surface parallel to the Y-axis, in the THz device module according to the embodiment.

Similarly, in the THz device module 100 according to the embodiment, FIG. 22 shows an explanatory diagram of the electromagnetic field simulation (the height h of the submount=500 µm) executed using the HFSS on the surface parallel to the X-axis; and FIG. 23 shows a result of the electromagnetic field simulation (the height h of the submount=500 µm) executed using the HFSS on the surface parallel to the Y-axis.

Figure 24:
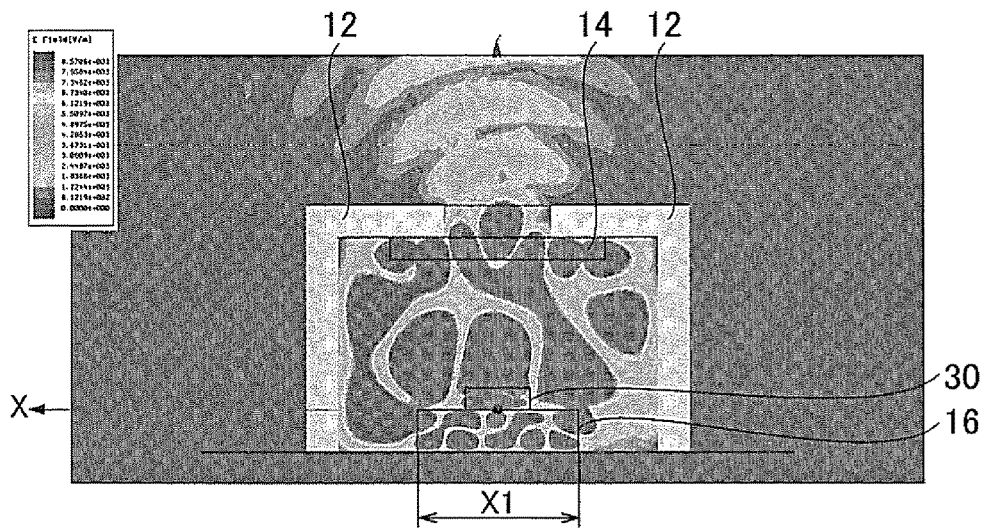
FIG. 24 shows the result of the electromagnetic field simulation (the height h of the submount=400 μm) executed using the HFSS on a surface parallel to the X-axis, in the THz device module according to the embodiment.
Figure 25:
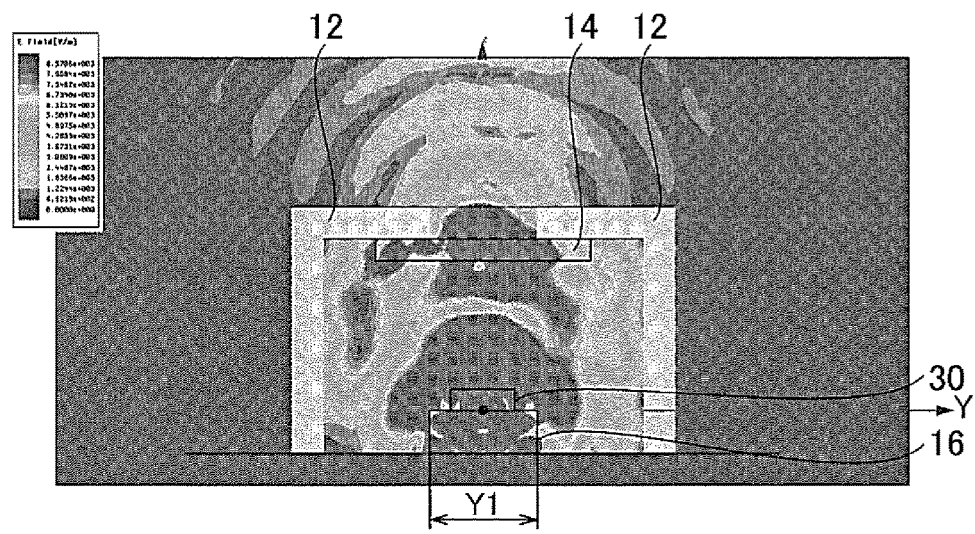
FIG. 25 shows a result of the electromagnetic field simulation (the height h of the submount=400 μm) executed using the HFSS on the surface parallel to the Y-axis, in the THz device module according to the embodiment.

Similarly, in the THz device module 100 according to the embodiment, FIG. 24 shows an explanatory diagram of the electromagnetic field simulation (the height h of the submount=400 µm) executed using the HFSS on the surface parallel to the X-axis; and FIG. 25 shows a result of the electromagnetic field simulation (the height h of the submount=400 µm) executed using the HFSS on the surface parallel to the Y-axis.

According to the above-mentioned results of the simulation calculation, it is proved that the electric field from the dipole antenna composing the THz device 30 mounted on the THz device module 100 can be propagated to the sealing member (glass) 14 within the near-field pattern, in the case of the height h of the submount=1200 μm or 800 μm.

(Relationship Between Ratio of Relative Intensity and Height of Submount Depending on Presence or Absence of Cap)

Figure 26:
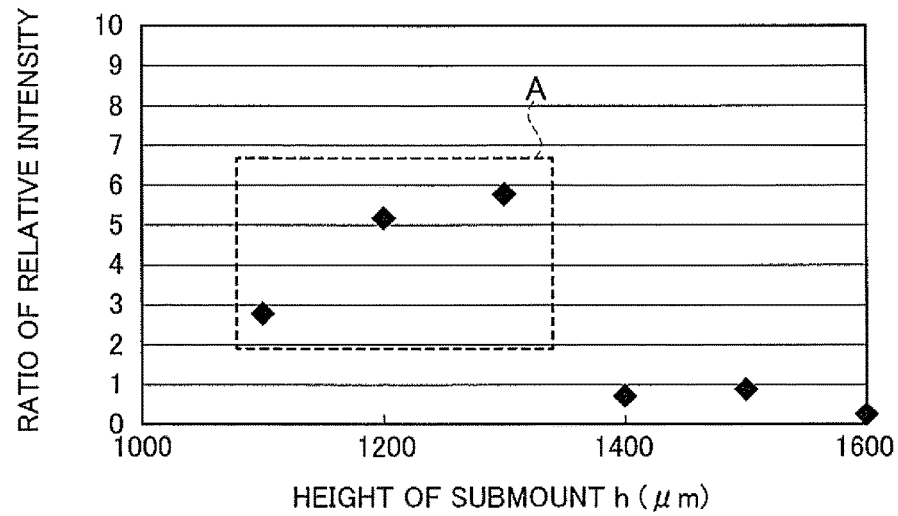
FIG. 26 is a diagram showing a relationship between a ratio of the relative intensity and the height h of the submount depending on a presence or absence of a cap, as an example of a package stem mounting simulation, in the THz device module according to the embodiment.

FIG. 26 shows a relationship between a ratio of the relative intensity and the height h of the submount depending on the presence or absence of the cap 12, as an example of the package stem mounting simulation, in the THz device module 100 according to the embodiment. The plots in the portion A shown in FIG. 26 correspond to the case of the presence of the cap 12.

It is proved that the ratio of the relative intensity is conversely increased by adopting the configuration of including the cap 12, as shown in FIG. 26, in the THz device module 100 according to the embodiment. For example, the ratio of the relative intensity can be increased by approximately 5.7 times at the maximum.

According to the THz device module 100 according to the embodiment, it is proved that the dipole antenna and the sealing member (glass) 14 composing the THz device 30 can function as an antenna with high efficiency, and thereby the electric field can be propagated to the sealing member (glass) 14 within the near-field pattern.

(Relationship Between Relative Intensity, and Height h of Submount and Distance D from Glass)

Figure 27:
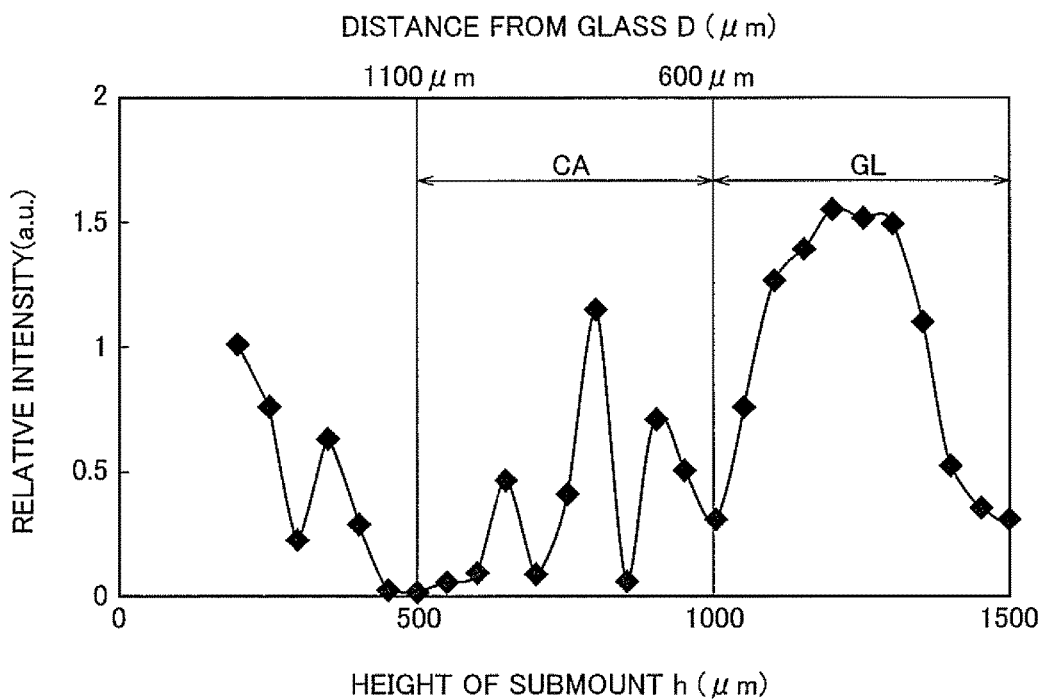
FIG. 27 is a diagram showing relationship between the relative intensity, and the height h of the submount and a distance D from a glass, as an example of the package stem mounting simulation, in the THz device module according to the embodiment.

FIG. 27 shows a relationship between the relative intensity, and the height h of the submount and a distance D from the sealing member (glass) 14, as an example of the package stem mounting simulation, in the THz device module 100 according to the embodiment.

As shown in the width CA in FIG. 27, it is proved that the relative intensity is changed at a complicated period due to an influence of a multiple reflection occurring in the cap 12, in the THz device module 100 according to the embodiment.

Moreover, as shown in the width GL in FIG. 27, it is proved that the electric field of the THz device 30 enters into the sealing member (glass) 14 within in the near-field pattern if the distance from the sealing member (glass) 14 is smaller than or equal to 500 μm ($\lambda/2$).

(Glass Surface Functioning as Radiation Antenna)

Figure 28:
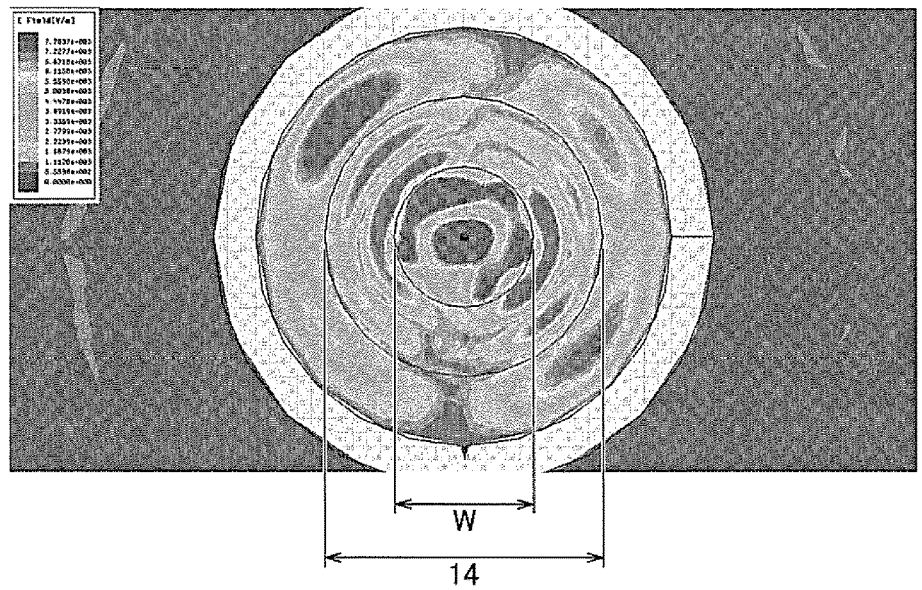
FIG. 28 shows a result of the electromagnetic field simulation (the height h of the submount=1200 μm) executed using the HFSS on a glass surface which functions as a radiation antenna, in the THz device module according to the embodiment.

FIG. 28 shows a result of the electromagnetic field simulation (the height h of the submount=1200 μm) executed using the HFSS on the glass surface which functions as a radiation antenna, in the THz device module 100 according to the embodiment. Moreover, FIG. 29 shows a result of the electromagnetic field simulation (the height h of the submount=800 μm) executed using the HFSS, and FIG. 30 shows a result of the electromagnetic field simulation (the height h of the submount=500 μm) executed using the HFSS.

Figure 29:
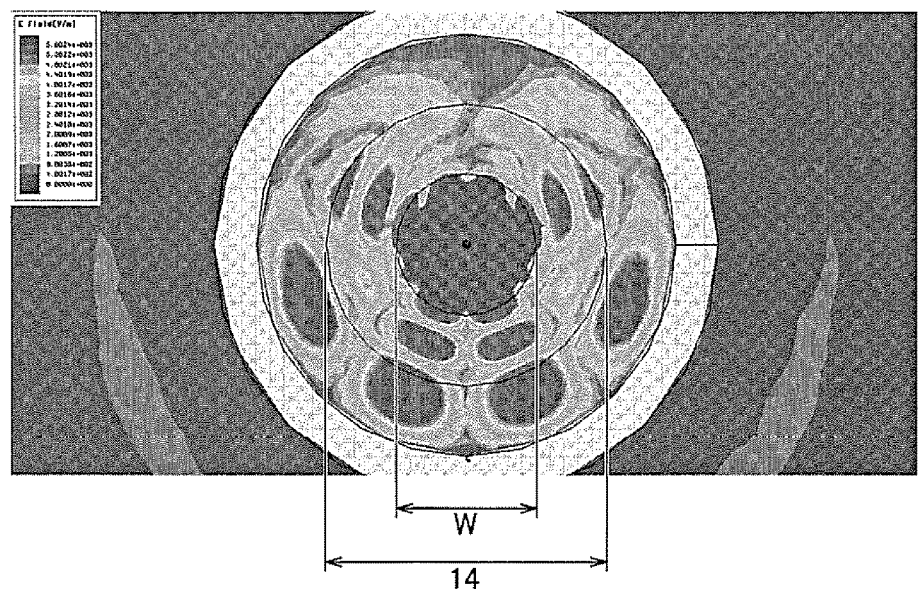
FIG. 29 shows a result of the electromagnetic field simulation (the height h of the submount=800 μm) executed using the HFSS on the glass surface which functions as a radiation antenna, in the THz device module according to the embodiment.
Figure 30:
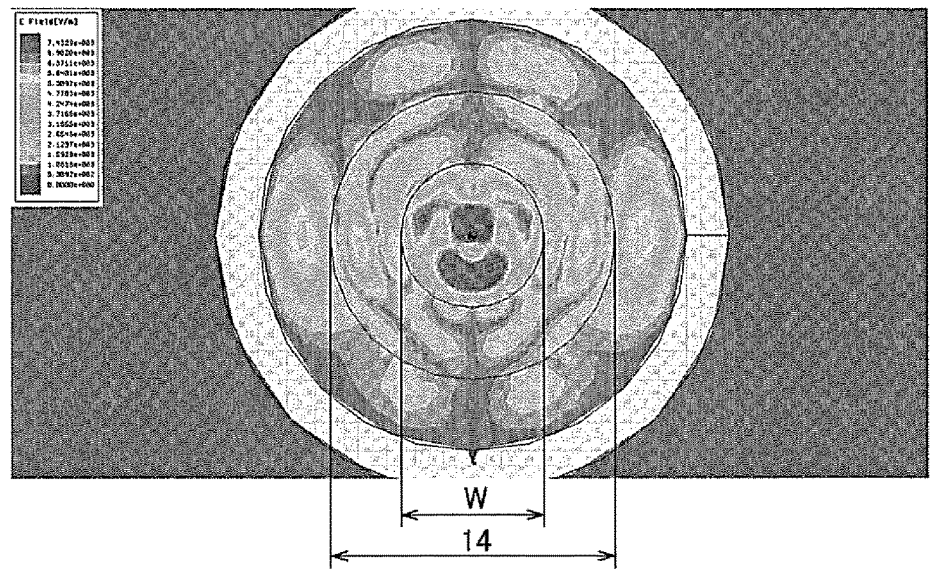
FIG. 30 shows a result of the electromagnetic field simulation (the height h of the submount=500 μm) executed using the HFSS on the glass surface which functions as a radiation antenna, in the THz device module according to the embodiment.

As shown in FIGS. 28-30, it is proved that a glass surface of the sealing member 14 of the opening is capable of functioning as an antenna due to resonance in the emission surface, in the THz device module 100 according to the embodiment.

(Relationship Between Relative Intensity and in-Plane Displacement of THz Device Disposed on Submount)

Figure 31:
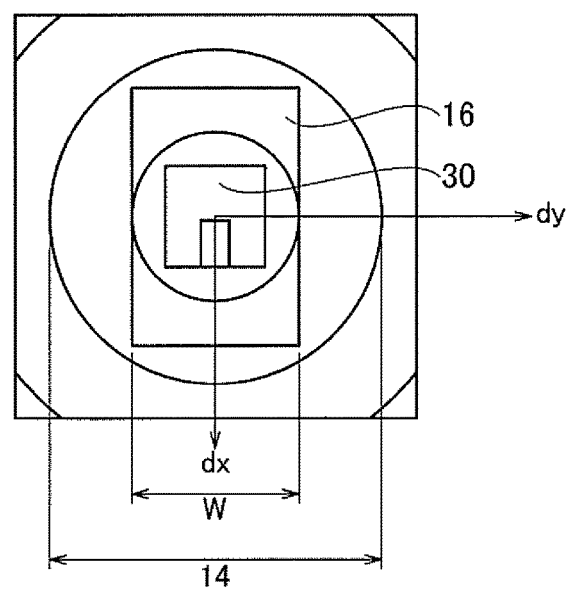
FIG. 31 is a top view diagram for explaining displacements dx and dy depending on an in-plane position of a THz device disposed on a submount 16, as an example of the package stem mounting simulation, in the THz device module according to the embodiment.

FIG. 31 shows a diagram for explaining displacements dx and dy depending on an in-plane position of the THz device 30 disposed on the submount 16, as an example of the package stem mounting simulation, in the THz device module 100 according to the embodiment.

Figure 32:
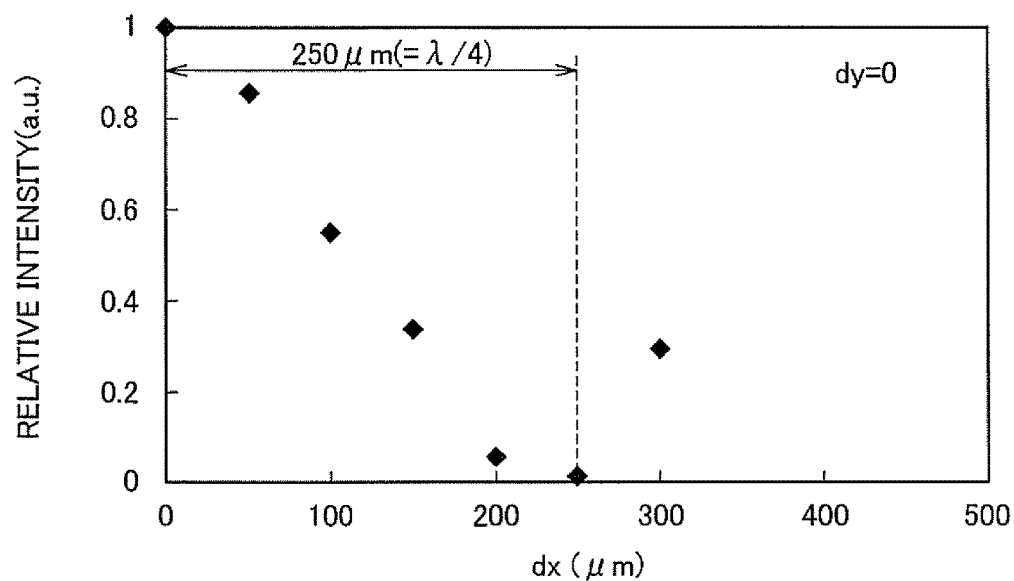
FIG. 32 is a diagram for explaining a relationship between the relative intensity and the displacement dx in an X axial direction, as an example of the package stem mounting simulation, in the THz device module according to the embodiment.
Figure 33:
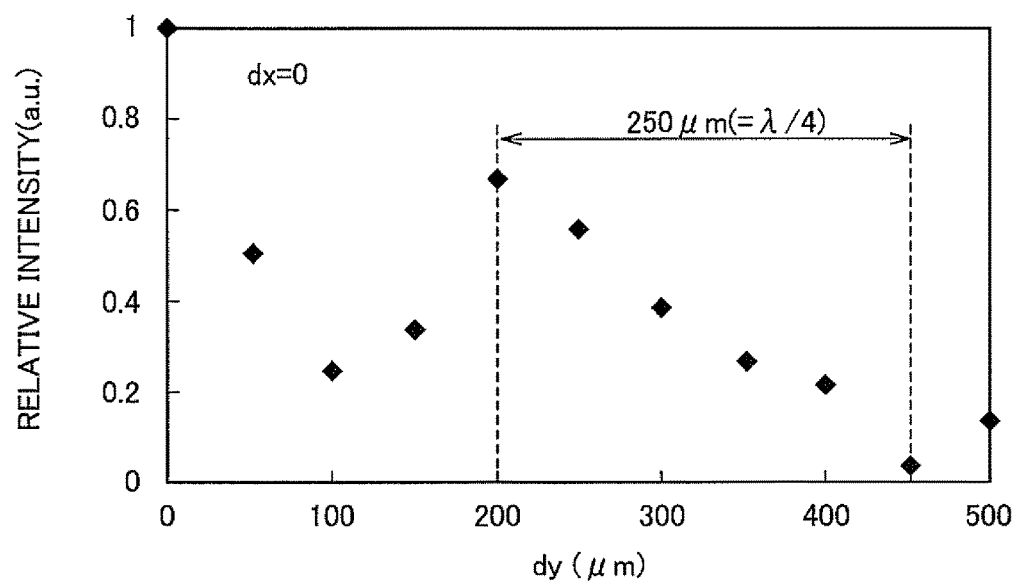
FIG. 33 is a diagram for explaining a relationship between the relative intensity and the displacement dy in an Y axial direction, as an example of the package stem mounting simulation, in the THz device module according to the embodiment.

In the THz device module 100 according to the embodiment, FIG. 32 shows a relationship between the relative intensity and the displacement dx in the X axial direction, as an example of the package stem mounting simulation, and FIG. 33 shows a relationship between the relative intensity and the displacement dy in the Y axial direction. Both are the results of calculating with the height h of the submount=1200 μm. In the package stem mounting simulation, a position in the package stem (x, y) is displaced in increments of 50 μm step.

As shown in FIGS. 32 and 33, the highest efficiency can be obtained when placing the THz device 30 on a center (dx=0, dy=0), as a comparison between the in-plane positions, in the THz device module 100 according to the embodiment. Moreover, as shown in FIGS. 32 and 33, it is proved that the relative intensity is changed from a peak level to a bottom level, if the position is shifted by only approximately 250 μm (=quarter wavelength) in the direction dx and the direction dy.

(Relationship Between Relative Intensity and Diameter W of Glass)

Figure 34:
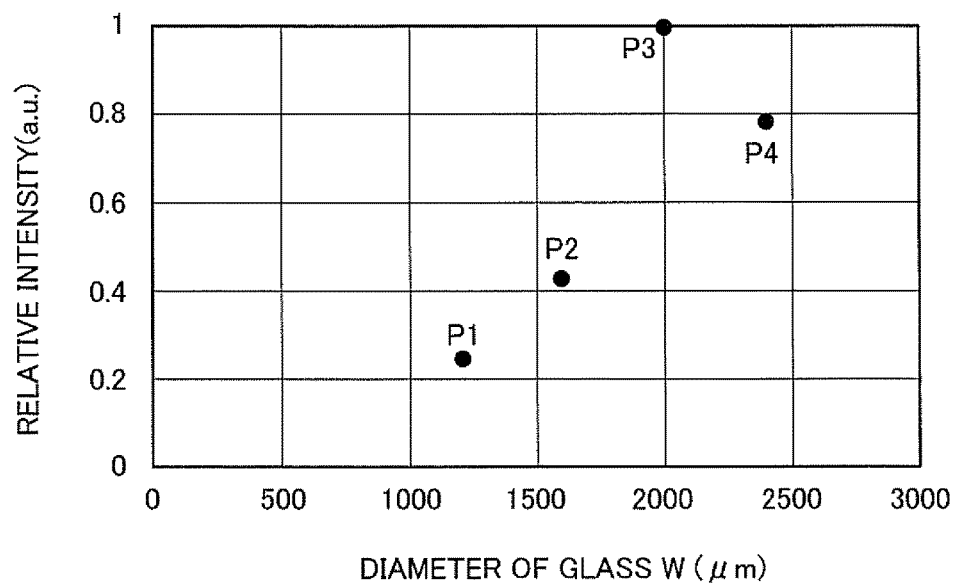
FIG. 34 is a diagram for explaining a relationship between the relative intensity and a diameter W of the glass, as an example of the package stem mounting simulation, in the THz device module according to the embodiment.

FIG. 34 shows a relationship between the relative intensity and a diameter W of the glass, as an example of the package stem mounting simulation, in the THz device module 100 according to the embodiment.

Figure 35:
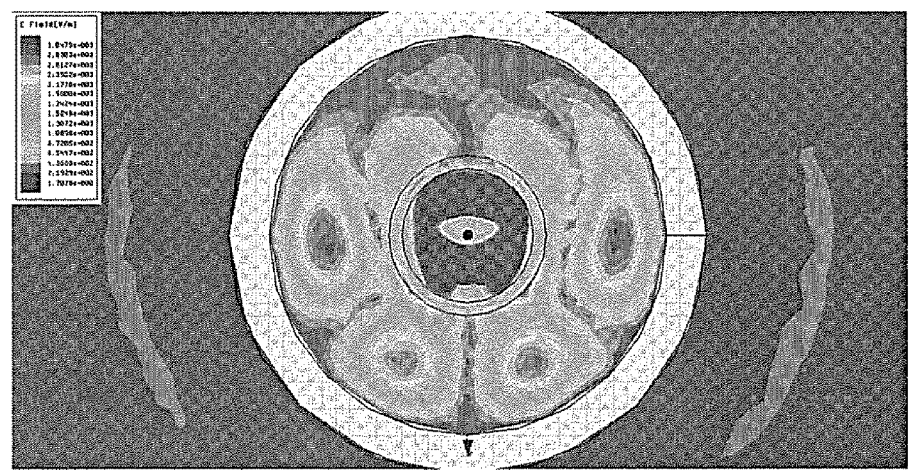
FIG. 35 shows a result of the electromagnetic field simulation (a diameter W of the glass=1200 μm) executed using the HFSS on a glass surface which functions as a radiation antenna, in the THz device module according to the embodiment.
Figure 36:
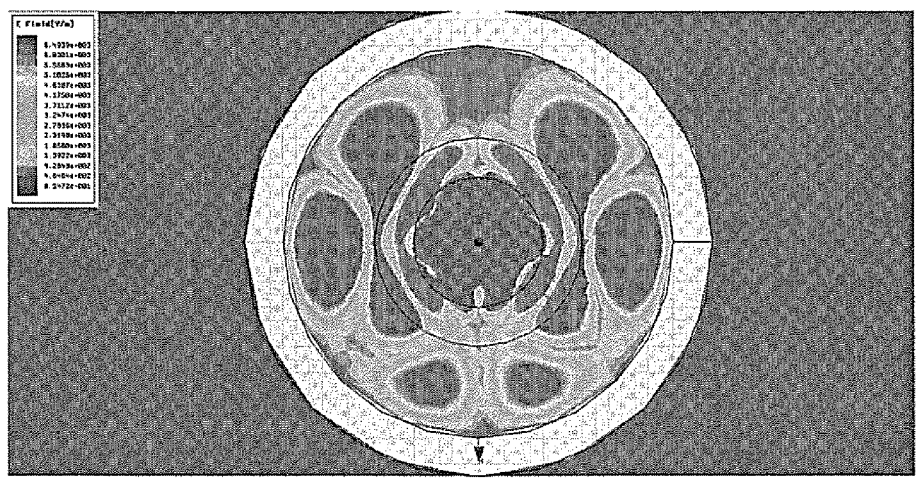
FIG. 36 shows a result of the electromagnetic field simulation (the diameter W of the glass=1600 μm) executed using the HFSS on the glass surface which functions as a radiation antenna, in the THz device module according to the embodiment.
Figure 37:
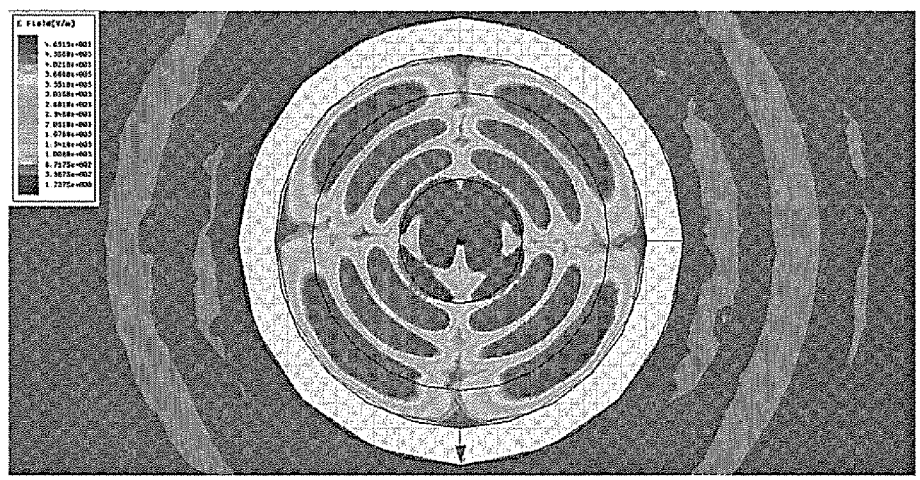
FIG. 37 shows a result of the electromagnetic field simulation (the diameter W of the glass=2000 μm) executed using the HFSS on the glass surface which functions as a radiation antenna, in the THz device module according to the embodiment.

Moreover, FIG. 35 shows a result of the electromagnetic field simulation (the diameter W of the glass=1200 μm) executed using the HFSS on the glass surface which functions as a radiation antenna, in the THz device module 100 according to the embodiment. FIG. 36 shows a result of the electromagnetic field simulation (the diameter W of the glass=1600 μm) executed using the HFSS, and FIG. 37 shows a result of the electromagnetic field simulation (the diameter W of the glass=2000 μm) executed using the HFSS. The results of the electromagnetic field simulations executed using the HFSS shown in FIGS. 35-37 respectively correspond to the plots P1-P3 shown in FIG. 34.

The wavelength of the THz waves at the time of the oscillation frequency of 300 GHz is 1 mm, and therefore the result of the diameter W of the glass=2000 μm proves a satisfactory result of the electromagnetic field simulation of the in-plane resonance (FIG. 37). It is proved that matching between the oscillation frequency and the diameter of the glass is important from the results of the electromagnetic field simulations executed using the HFSS shown in FIGS. 35-37.

(Transmission and Reception Operations)

Figure 38:
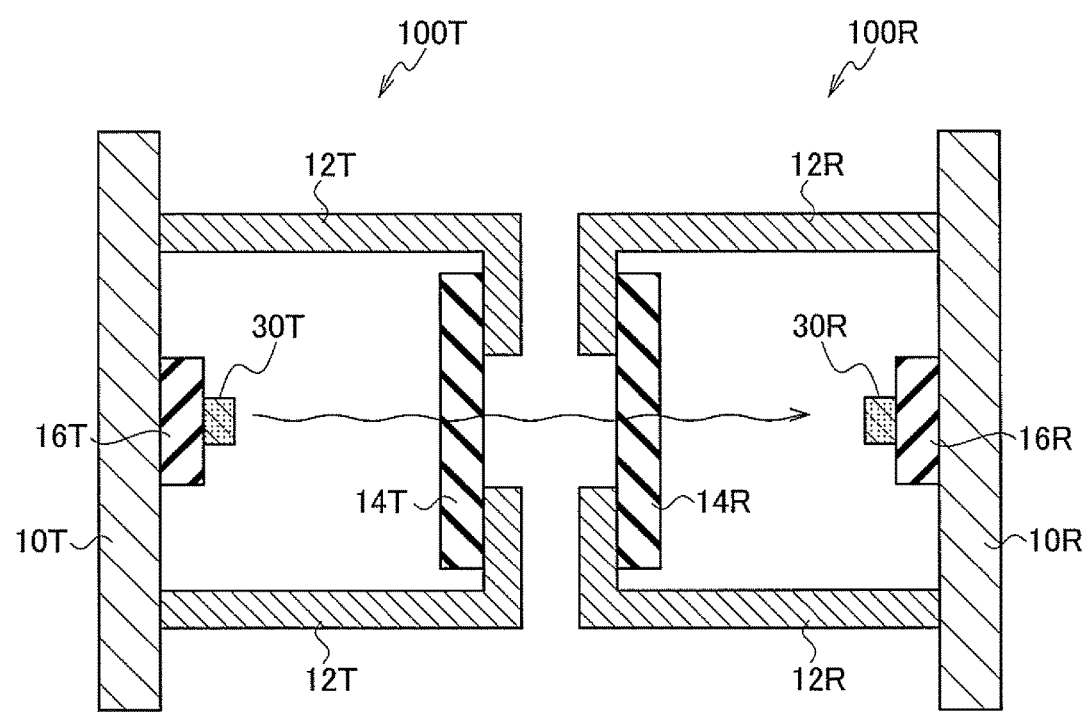
FIG. 38 is a schematic cross-sectional structure diagram for explaining a transmission and reception operation when the THz device modules according to the embodiment respectively function as a transmitter and a receiver.

The THz device module according to the embodiment can be configured as each of a transmitter module 100T and a receiver module 100R, as shown in FIG. 38. FIG. 38 shows a schematic cross-sectional structure for explaining transmission and reception operations when the THz device modules according to the embodiment function as the transmitter module 100T and the receiver module 100R.

As shown in FIG. 38, the transmitter module 100T includes: a package stem 10T; a submount 16T disposed on the package stem 10T; a THz device 30T disposed on the submount 16T; a cap 12T disposed on the package stem 10T, the cap 12T containing the submount 16T and the THz device 30T, the cap 12T including an opening; and a sealing member 14T connected to the cap 12T, the sealing member 14T configured to seal the opening. In the embodiment, the sealing member 14T functions as an antenna, and thereby can emit the THz waves from the opening.

As shown in FIG. 38, the receiver module 100R includes: a package stem 10R; a submount 16R disposed on the package stem 10R; a THz device 30R disposed on the submount 16R; a cap 12R disposed on the package stem 10R, the cap 12R containing the submount 16R and the THz device 30R, the cap 12R including an opening; and a sealing member 14R connected to the cap 12R, the sealing member 14R configured to seal the opening. In the embodiment, the sealing member 14R functions as an antenna, and thereby can detect the THz waves from the opening.

The THz device modules according to the embodiment respectively functions as the transmitter module 100T and the receiver module 100R, and the transmitter module 100T and the receiver module 100R are disposed so as to be opposed to each other, as shown in FIG. 38. Thereby, the THz waves emitted from the transmitter module 100T can be efficiently detected by the receiver module 100R.

Moreover, the THz device modules according to the embodiment respectively function as the transmitter module 100T and the receiver module 100R. Moreover, the THz device 30T having the in-plane light-emitting radiating pattern is mounted on the transmitter module 100T, and the THz device 30R having the in-plane light-receiving pattern is mounted on the receiver module 100R, and the respective sealing members 14T and 14R respectively function as antennas. Thereby, the THz waves can be efficiently radiated and detected from the opening of which the diameter is the same degree as the wavelength thereof.

As explained above, according to the embodiments, there can be provided the THz device module capable of efficiently emitting or detecting the THz waves from the opening of the cap, thereby suppressing upsizing of the cap.

OTHER EMBODIMENTS

As explained above, the THz device module according to the embodiments has been described, as a disclosure including associated description and drawings to be construed as illustrative, not restrictive. This disclosure makes clear a variety of alternative embodiments, working examples, and operational techniques for those skilled in the art.

Such being the case, the embodiments described herein cover a variety of embodiments, whether described or not.

INDUSTRIAL APPLICABILITY

The THz device module of the embodiments can be applied to THz oscillators, THz detectors, high-frequency resonant circuits, signal amplifiers, etc. on a device basis; and can be applied to wide fields, such as measurement in various fields, e.g., a physical property, an astronomy, a biology, etc. and a security field, other than large-capacity communications and information processing of THz wave imaging devices, sensing devices, high-speed wireless communications devices, etc., on an applicability basis.

What is claimed is:
1. A terahertz device module comprising:
a substrate;
a terahertz device disposed on a front side surface of the substrate, the terahertz device configured to oscillate or detect terahertz waves;
a cap configured to cover the terahertz device so as to be separated from the terahertz device, the cap comprising an opening formed at a position opposite to the terahertz device in a vertical direction of the front side surface of the substrate; and
a sealing member configured to cover the opening of the cap so as to seal the terahertz device in conjunction with the substrate and the cap, wherein
a distance from the terahertz device to the sealing member is within a near-field pattern to which an electric field of the terahertz waves can be reached without interruption from a surface of the terahertz device to the sealing member.

2. The terahertz device module according to claim 1, wherein
a width of the opening is formed so as to be equal to 1 wavelength of the terahertz waves.

3. The terahertz device module according to claim 1, wherein
the distance from the terahertz device to the sealing member is shorter than a half wavelength of the terahertz waves.

4. The terahertz device module according to claim 1, wherein
a diameter of the opening is within a range of 0.1 time to several times as long as a wavelength of the terahertz waves emitted or detected from the opening.

5. The terahertz device module according to claim 1, further comprising:
a submount disposed on the substrate, the submount configured to mount the terahertz device, wherein
a height of the submount is within a range of 0.2 time to 1.5 times as long as a wavelength of the terahertz waves emitted or detected from the opening.

6. The terahertz device module according to claim 1, wherein
the sealing member comprises a substrate selected from the group of consisting of a glass substrate and a silicon substrate.

7. The terahertz device module according to claim 1, wherein
the electric field resonates in a plane of the cap including the opening.

8. The terahertz device module according to claim 1, wherein
the terahertz device has a surface light-emission radiating pattern or a surface light-receiving pattern.

9. The terahertz device module according to claim 1, wherein the terahertz device comprises:
a semiconductor substrate;
a first semiconductor layer disposed on the semiconductor substrate;
an active element formed by being laminated on the first semiconductor layer;
a second electrode connected to the first semiconductor layer so as to be connected to one side of a main electrode of the active element, the second electrode disposed on the semiconductor substrate; and
a first electrode connected to another side of the main electrode of the active element, the first electrode disposed on the semiconductor substrate so as to be opposite to the second electrode, wherein
the active element forms a resonator between the second electrode and the first electrode, wherein
electromagnetic waves are reflected on the substrate, and the electromagnetic waves have a surface light-emission radiating pattern or surface light-receiving pattern in a vertical direction with respect to the semiconductor substrate.

10. The terahertz device module according to claim 9, wherein
the first electrode and the second electrode comprise a dipole antenna.

11. The terahertz device module according to claim 10, further comprising:
a first feed electrode line and a second feed electrode line each which is connected to the dipole antenna; and
a first pad electrode and a second pad electrode respectively connected to the first feed electrode line and the second feed electrode line.

12. The terahertz device module according to claim 11, further comprising
an MIM reflector connected between the first pad electrode and the second pad electrode.

13. The terahertz device module according to claim 9, further comprising
a resistance element connected between the first electrode and the second electrode.

14. The terahertz device module according to claim 13, wherein
the resistance element comprises metallic wiring.

15. The terahertz device module according to claim 14, wherein
the metallic wiring comprises one selected from the group consisting of Bi, Ni, Ti, and Pt.

16. The terahertz device module according to claim 9, wherein
the active element is arranged as multichip implementation.

17. The terahertz device module according to claim 16, wherein
the active element is arranged as cell array implementation.

18. The terahertz device module according to claim 9, wherein
the active element comprises one selected from the group consisting of a resonant tunneling diode, a TUNNETT diode, an IMPATT diode, a GaAs based field-effect transistor, a GaN based FET, a high electron mobility transistor, a hetero-junction bipolar transistor, and CMOSFET.

* * * * *